United States Patent
Sauers et al.

(10) Patent No.: US 11,123,921 B2
(45) Date of Patent: Sep. 21, 2021

(54) METHOD AND SYSTEM FOR IN SITU CROSS-LINKING OF MATERIALS TO PRODUCE THREE-DIMENSIONAL FEATURES VIA ELECTRON BEAMS FROM MOBILE ACCELERATORS

(71) Applicant: Fermi Research Alliance, LLC, Batavia, IL (US)

(72) Inventors: Aaron Sauers, Aurora, IL (US); Robert Kephart, Pioneer, CA (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 467 days.

(21) Appl. No.: 16/179,546

(22) Filed: Nov. 2, 2018

(65) Prior Publication Data
US 2020/0139620 A1 May 7, 2020
US 2020/0316853 A2 Oct. 8, 2020

(51) Int. Cl.
*B29C 64/00* (2017.01)
*B29C 64/135* (2017.01)
*H01J 37/305* (2006.01)
*H01J 37/06* (2006.01)
*H01J 37/147* (2006.01)
*E01C 11/00* (2006.01)
*B29C 64/264* (2017.01)
*B33Y 10/00* (2015.01)
(Continued)

(52) U.S. Cl.
CPC .......... *B29C 64/135* (2017.08); *B29C 64/264* (2017.08); *B33Y 10/00* (2014.12); *E01C 11/005* (2013.01); *E01C 23/14* (2013.01); *H01J 37/06* (2013.01); *H01J 37/1472* (2013.01); *H01J 37/305* (2013.01); *B29K 2105/24* (2013.01)

(58) Field of Classification Search
CPC . B29C 64/135; B29C 64/264; B29K 2105/24; E01C 11/005; E01C 23/14; H01J 37/06; H01J 37/305; H01J 37/1472; B33Y 10/00
USPC ...................................... 404/77, 95
See application file for complete search history.

(56) References Cited

U.S. PATENT DOCUMENTS 5,014,207 A * 5/1991 Lawton .................. G09B 25/00
700/120
6,172,463 B1 1/2001 Roy
6,713,540 B2 3/2004 Rached et al.
(Continued)

FOREIGN PATENT DOCUMENTS

EP  0 731 232 A2  9/1996
EP  1 645 587 A1  4/2006
(Continued)

*Primary Examiner* — Raymond W Addie
(74) *Attorney, Agent, or Firm* — Loza & Loza, LLP; Kevin L. Soules

(57) ABSTRACT

A method and system for in situ cross-linking of polymers, Bitumen, and other materials to produce arbitrary functional or ornamental three-dimensional features using electron beams provided by mobile accelerators comprises defining a desired pattern for imparting on a target area, mapping the target area, defining at least one discrete voxel in the target area according to the desired pattern to be imparted on the target area, assigning an irradiation value to each of the at least one discrete voxels, and delivering a dose of irradiation to each of the at least one discrete voxels according to the assigned irradiation value.

7 Claims, 17 Drawing Sheets

(51) Int. Cl.
*E01C 23/14* (2006.01)
*B29K 105/24* (2006.01)

(56) References Cited

U.S. PATENT DOCUMENTS

| | | | |
|---|---|---|---|
| 6,753,478 B2 | 6/2004 | Rodway et al. | |
| 8,198,350 B2 | 6/2012 | Fee et al. | |
| 8,277,738 B2 | 10/2012 | Kim et al. | |
| 8,389,642 B2 | 3/2013 | Goto et al. | |
| 8,674,630 B1 | 3/2014 | Cornelius | |
| 8,779,697 B2 | 7/2014 | Baurichter et al. | |
| 9,186,645 B2 | 11/2015 | Kephart | |
| 9,340,931 B2 | 5/2016 | Kephart | |
| 9,398,681 B2 | 7/2016 | Tantawi et al. | |
| 10,070,509 B2 | 11/2018 | Kephart | |
| 2004/0085096 A1 | 5/2004 | Ward et al. | |
| 2005/0074511 A1* | 4/2005 | Oriakhi | B33Y 10/00 425/174.4 |
| 2008/0068112 A1 | 3/2008 | Yu et al. | |
| 2011/0081553 A1 | 4/2011 | Mehlmann et al. | |
| 2012/0295048 A1 | 11/2012 | Al-Malaika et al. | |
| 2012/0326636 A1 | 12/2012 | Eaton et al. | |
| 2013/0316087 A1 | 11/2013 | Ahn et al. | |
| 2014/0119829 A1* | 5/2014 | Eliot | E01C 23/065 404/113 |
| 2014/0270955 A1 | 9/2014 | Coe | |
| 2016/0035531 A1 | 2/2016 | Lunin et al. | |
| 2018/0185955 A1* | 7/2018 | Hsu | B33Y 10/00 |
| 2020/0130256 A1* | 4/2020 | Debora | B32B 27/36 |

FOREIGN PATENT DOCUMENTS

| | | |
|---|---|---|
| EP | 1 396 580 B1 | 6/2006 |
| EP | 1 690 702 B1 | 5/2012 |
| WO | 2002100133 | 12/2002 |
| WO | 2013090342 A1 | 6/2013 |
| WO | 2016043783 A1 | 3/2016 |

* cited by examiner

METHOD AND SYSTEM FOR IN SITU CROSS-LINKING OF MATERIALS TO PRODUCE THREE-DIMENSIONAL FEATURES VIA ELECTRON BEAMS FROM MOBILE ACCELERATORS

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of control systems. Embodiments are also related to the field of manufacturing. Embodiments are further related to the field of electron beam manufacturing. Embodiments are also related to electron accelerators. Embodiments are also related to the cross-linking of materials such as synthetic polymer. Embodiments additionally relate to methods and systems for rapid and deep pre-heating of surfaces, surface preparation, treating, and strengthening materials. Embodiments are also related to the field of mobile accelerators. Embodiments are further related to methods, systems, and apparatuses for in situ cross-linking of polymers, Bitumen, and other materials to produce arbitrary functional or ornamental three-dimensional features using electron beams provided by mobile accelerators.

BACKGROUND

Accelerators originally developed for scientific applications are currently used for broad industrial, medical, and security applications. Over 30,000 accelerators find some use in producing over $500 billion per year in products and services, creating a major impact on the economy. Industrial accelerators must be cost effective, simple, versatile, efficient, and robust.

An electron accelerator refers generally to a type of apparatus capable of accelerating electrons generated from an electron gun in a vacuum condition through a high voltage generator or RF structure to impart increased energy to the electron, and diffusing the electrons so as to emit electron beams having high energy close to the speed of light through a beam extraction device so that the electrons are extracted from the vacuum condition and can impinge on a target object. The electron accelerator accelerates the electrons generated from the electron gun and emits the electron beams having a regular width while scanning in a scan coil in the beam extraction device so as to cause the electron beams to irradiate a target object in a controlled fashion.

Many industrial applications for electron accelerators require high-average beam power. Recent developments have dramatically reduced the size of electron accelerators, paving the way for a number of new associated technologies.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method, system, and apparatus for control systems.

It is an aspect of the disclosed embodiments to provide methods and systems for manufacturing.

It is an aspect of the disclosed embodiments to provide methods and systems for electron beam manufacturing.

It is an aspect of the disclosed embodiments to provide methods and systems for electron accelerator manufacturing.

It is an aspect of the disclosed embodiments to provide methods and systems for cross-linking of materials.

It is an aspect of the disclosed embodiments to provide methods and systems for rapid and deep pre-heating of surfaces, surface preparation, treating, and strengthening materials.

It is an aspect of the disclosed embodiments to provide methods and systems for in situ cross-linking of polymers, Bitumen, and other materials to produce arbitrary functional or ornamental three-dimensional features using electron beams provided by mobile accelerators.

In an exemplary embodiment, a method for fabrication includes defining a desired pattern for imparting on a target area, mapping the target area, defining at least one discrete voxel in the target area, according to the desired pattern to be imparted on the target area, assigning an irradiation value to each of the at least one discrete voxels, and delivering a dose of irradiation to each of the at least one discrete voxels according to the assigned irradiation value. In an embodiment, the method further comprises delivering the dose of irradiation with an accelerator. In an embodiment the method comprises adjusting a duty factor of the accelerator according to the assigned irradiation value for each of the at least one discrete voxels. In an embodiment delivering the dose of irradiation further comprises at least one of: directing an electron beam accelerator mounted to a vehicle through the target area, and sweeping an electron beam over the target area. The method further comprises directing the vehicle in a predefined path, wherein the predefined path is selected according to the desired pattern for imparting on the target area. In an embodiment the method further comprises determining a position of the vehicle in the target area with at least one sensor. In an embodiment the method further comprises depositing a cross-linking material in the target area. In an embodiment the accelerator comprises an electron beam accelerator mounted to a vehicle. In an embodiment the target area is at least one of: two-dimensional, and three-dimensional. In another embodiment the method further comprises iteratively creating a plurality of layers, the plurality of layers forming a three-dimensional structure.

In an embodiment a fabrication system comprises a mobile accelerator system, and a control system configured for: defining a desired pattern for imparting on a target area, mapping the target area defining at least one discrete voxel in the target area, according to the desired pattern to be imparted on the target area, and assigning an irradiation value to each of the at least one discrete voxels; wherein the mobile accelerator system delivers a dose of irradiation to each of the at least one discrete voxels according to the assigned irradiation value. In an embodiment the mobile accelerator system further comprises a mobile unit, an accelerator, and a beam bending assembly, the beam bending assembly adjusting a terminal position of a beam provided by the accelerator. In an embodiment the beam bending assembly comprises at least one beam bending magnet. In an embodiment the beam bending assembly comprises a beam bending snout. In an embodiment the beam bending assembly is configured to direct an electron beam from the accelerator through the target area. In an embodiment the system further comprises a vehicle for moving the mobile accelerator system in a predefined path, the predefined path selected according to the desired pattern for imparting on the target area. The system can further comprise at least one position sensor configured for determining a position of the mobile accelerator assembly in the target area.

In another embodiment a fabrication method comprises designing a structure, defining at least one discrete voxel in the structure, assigning an irradiation value to each of the at least one discrete voxels, covering a build surface with material, and delivering a dose of irradiation to each of the at least one discrete voxels according to the assigned irradiation value. In an embodiment the method further comprises preparing the build surface for fabrication. In an embodiment the method further comprises iteratively creating a plurality of layers associated with the structure.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
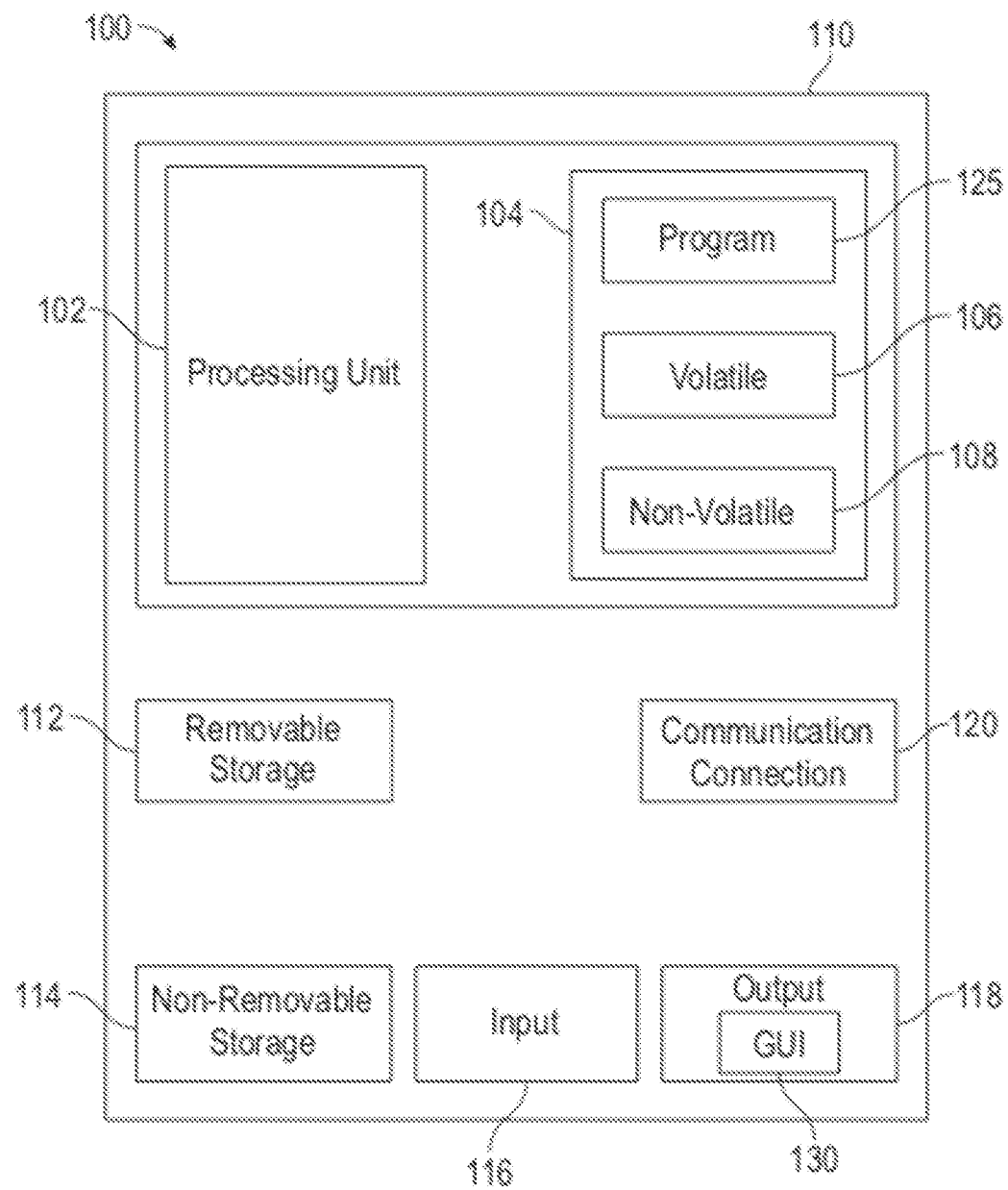
FIG. 1 depicts a block diagram of a computer system which is implemented in accordance with the disclosed embodiments.

The particular values and configurations discussed in the following non-limiting examples can be varied, and are cited merely to illustrate one or more embodiments and are not intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. In addition, the term "based on" may be understood as not necessarily intended to convey an exclusive set of factors and may, instead, allow for existence of additional factors not necessarily expressly described, again, depending at least in part on context.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
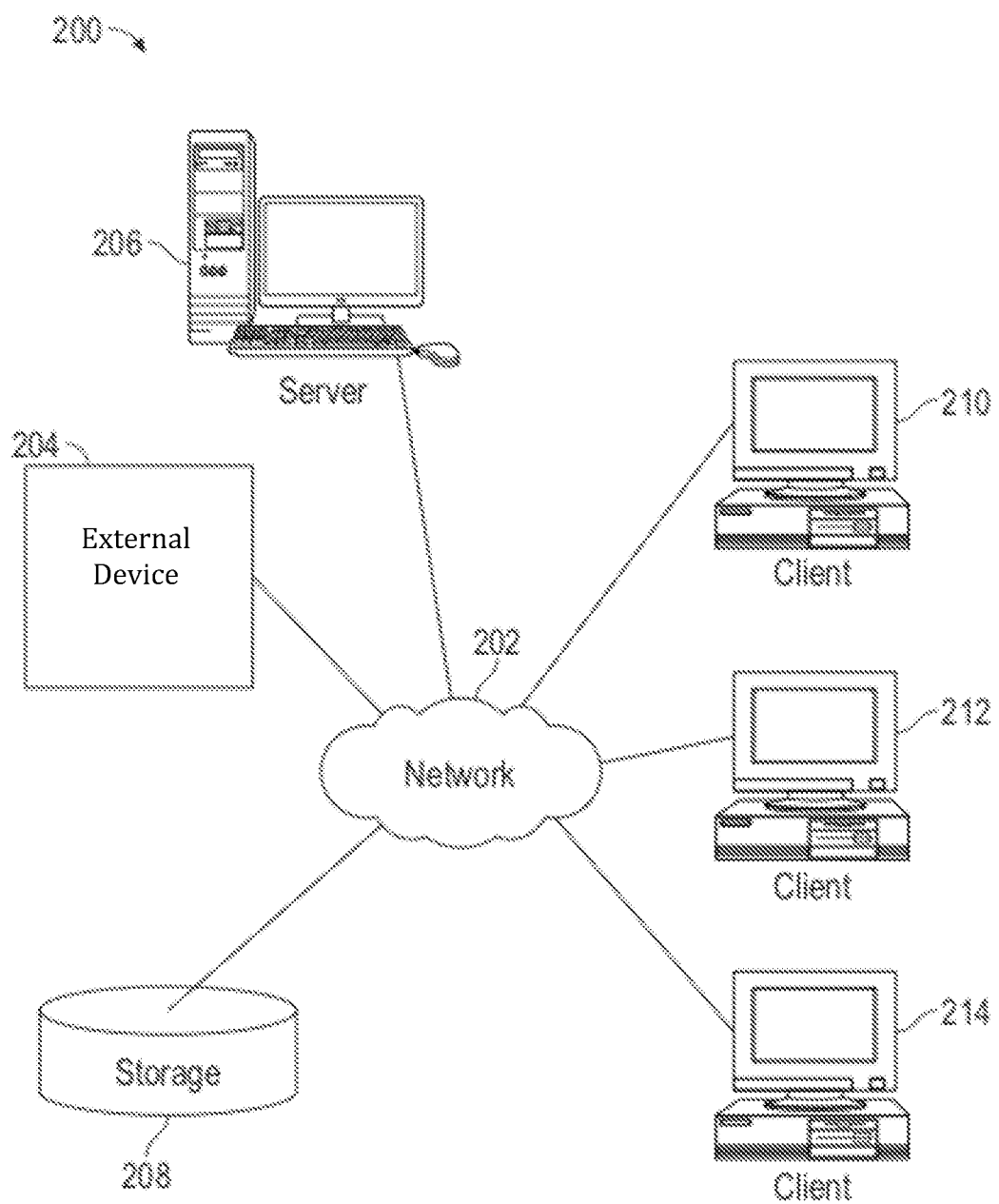
FIG. 2 depicts a graphical representation of a network of data-processing devices in which aspects of the present embodiments may be implemented.
Figure 3:
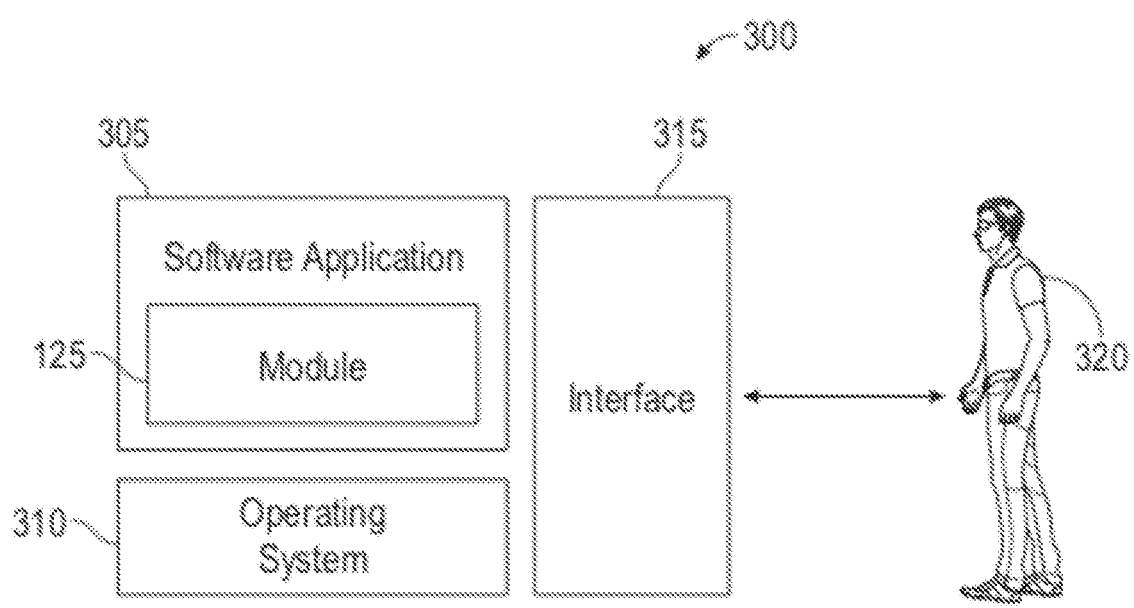
FIG. 3 depicts a computer software system for directing the operation of the data-processing system depicted in FIG. 1, in accordance with an embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing parts of the methods and systems disclosed herein is shown in FIG. 1. A computing device in the form of a computer 110 configured to interface with sensors, peripheral devices, and other elements disclosed herein may include one or more processing units 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data including image data.

Computer 110 may include or have access to a computing environment that includes input 116, output 118, and a communication connection 120. The computer may operate in a networked environment using a communication connection 120 to connect to one or more remote computers, remote sensors, detection devices, hand-held devices, multi-function devices (MFDs), mobile devices, tablet devices, mobile phones, Smartphones, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 2 below.

Output 118 is most commonly provided as a computer monitor, but may include any output device. Output 118 and/or input 116 may include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user, and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module or node 125, which can be representative of other modules or nodes described herein, are stored on a computer-readable medium and are executable by the processing unit 102 of computer 110. Program module or node 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 is a network of computers or other such devices such as mobile phones, smartphones, sensors, detection devices, controllers and the like in which embodiments of the present invention may be implemented. Note that the system 200 can be implemented in the context of a software module such as program module 125. The system 200 includes a network 202 in communication with one or more clients 210, 212, and 214. Network 202 may also be in communication with one or more device 204, servers 206, and storage 208. Network 202 is a medium that can be used to provide communications links between various devices and computers connected together within a networked data processing system such as computer system 100. Network 202 may include connections such as wired communication links, wireless communication links of various types, fiber optic cables, quantum, or quantum encryption, or quantum teleportation networks, etc. Network 202 can communicate with one or more servers 206, one or more external devices such as a controller, actuator, sensor, or other such device 204, and a memory storage unit such as, for example, memory or database 208. It should be understood that device 204 may be embodied as a detector device, microcontroller, controller, receiver, transceiver, or other such device.

In the depicted example, device 204, server 206, and clients 210, 212, and 214 connect to network 202 along with storage unit 208. Clients 210, 212, and 214 may be, for example, personal computers or network computers, hand-held devices, mobile devices, tablet devices, smartphones, personal digital assistants, microcontrollers, recording devices, MFDs, etc. Computer system 100 depicted in FIG. 1 can be, for example, a client such as client 210 and/or 212.

Computer system 100 can also be implemented as a server such as server 206, depending upon design considerations. In the depicted example, server 206 provides data such as boot files, operating system images, applications, and application updates to clients 210, 212, and/or 214. Clients 210, 212, and 214 and external device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet with network 202 representing a world-wide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) or node(s) 125, may be "loaded" (i.e., transferred from removable storage 114 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, handheld devices, mobile phones, smart phones, tablet devices, multi-processor systems, printers, copiers, fax machines, multi-function devices, data networks, microprocessor-based or programmable consumer electronics, networked personal computers, minicomputers, mainframe computers, servers, medical equipment, medical devices, and the like.

Note that the term module or node as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real time operating system (RTOS) more commonly employed in wireless systems may also be employed with respect to operating system 310 and interface 315. The software application 305 can include, for example, module(s) 125, which can include instructions for carrying out steps or logical operations such as those shown and described herein.

The following description is presented with respect to embodiments of the present invention, which can be embodied in the context of, or require the use of a data-processing system such as computer system 100, in conjunction with program module 125, and data-processing system 200 and network 202 depicted in FIGS. 1-3. The present invention, however, is not limited to any particular application or any particular environment. Instead, those skilled in the art will find that the systems and methods of the present invention may be advantageously applied to a variety of system and application software including database management systems, word processors, and the like. Moreover, the present invention may be embodied on a variety of different platforms including Windows, Macintosh, UNIX, LINUX, Android, Arduino and the like. Therefore, the descriptions of the exemplary embodiments, which follow, are for purposes of illustration and not considered a limitation.

U.S. Pat. No. 9,186,645, titled "METHOD AND SYSTEM FOR IN-SITU CROSS LINKING OF POLYMERS, BITUMEN AND SIMILAR MATERIALS TO INCREASE STRENGTH, TOUGHNESS AND DURABILITY VIA IRRADIATION WITH ELECTRON BEAMS FROM MOBILE ACCELERATORS," issued on Nov. 17, 2015 describes systems and methods for treating and strengthening a material, the systems and methods comprising a mobile unit, an electron gun that emits a beam of electrons, an electron accelerator integrated with the mobile unit that is positioned to accelerate the beam of electrons, and a beam extraction device comprising a scan coil that emits the accelerated beam of electrons, where the beam extracting device is positioned on the mobile unit to irradiate the surface of, and treat in-situ, a material located proximate to the mobile unit, wherein irradiation of the material by the beam of electrons results in in-situ cross-linking of the material and therefore a strengthening and increased durability of the material. U.S. Pat. No. 9,186,645 is herein incorporated by reference in its entirety.

U.S. Pat. No. 9,340,931, titled "METHOD AND SYSTEM FOR IN-SITU CROSS LINKING OF POLYMERS, BITUMEN AND SIMILAR MATERIALS TO INCREASE STRENGTH, TOUGHNESS AND DURABILITY VIA IRRADIATION WITH ELECTRON BEAMS FROM MOBILE ACCELERATORS," issued on May 17, 2016 describes systems and methods for treating and strengthening a material, the systems and methods comprising a mobile unit, an electron gun that emits a beam of electrons, an electron accelerator integrated with the mobile unit that is positioned to accelerate the beam of electrons, and a beam extraction device comprising a scan coil that emits the accelerated beam of electrons, where the beam extracting device is positioned on the mobile unit to irradiate the surface of, and treat in-situ, a material located proximate to the mobile unit, wherein irradiation of the material by the beam of electrons results in in-situ cross-linking of the material and therefore a strengthening and increased durability of the material. U.S. Pat. No. 9,340,931 is herein incorporated by reference in its entirety.

U.S. Pat. No. 10,070,509, titled "COMPACT SRF BASED ACCELERATOR," issued on Sep. 4, 2018, describes a particle accelerator comprising an accelerator cavity, an electron gun, and a cavity cooler configured to at least partially encircle the accelerator cavity. A cooling connector and an intermediate conduction layer are formed between the cavity cooler and the accelerator cavity to facilitate thermal conductivity between the cavity cooler and the accelerator cavity. The embodiments disclosed therein teach a viable, compact, robust, high-power, high-energy electron-beam, or x-ray source. The disclosed advances are integrated into a single design, that enables compact, mobile, high-power electron accelerators. U.S. Pat. No. 10,070,509 is herein incorporated by reference in its entirety.

Figure 4:
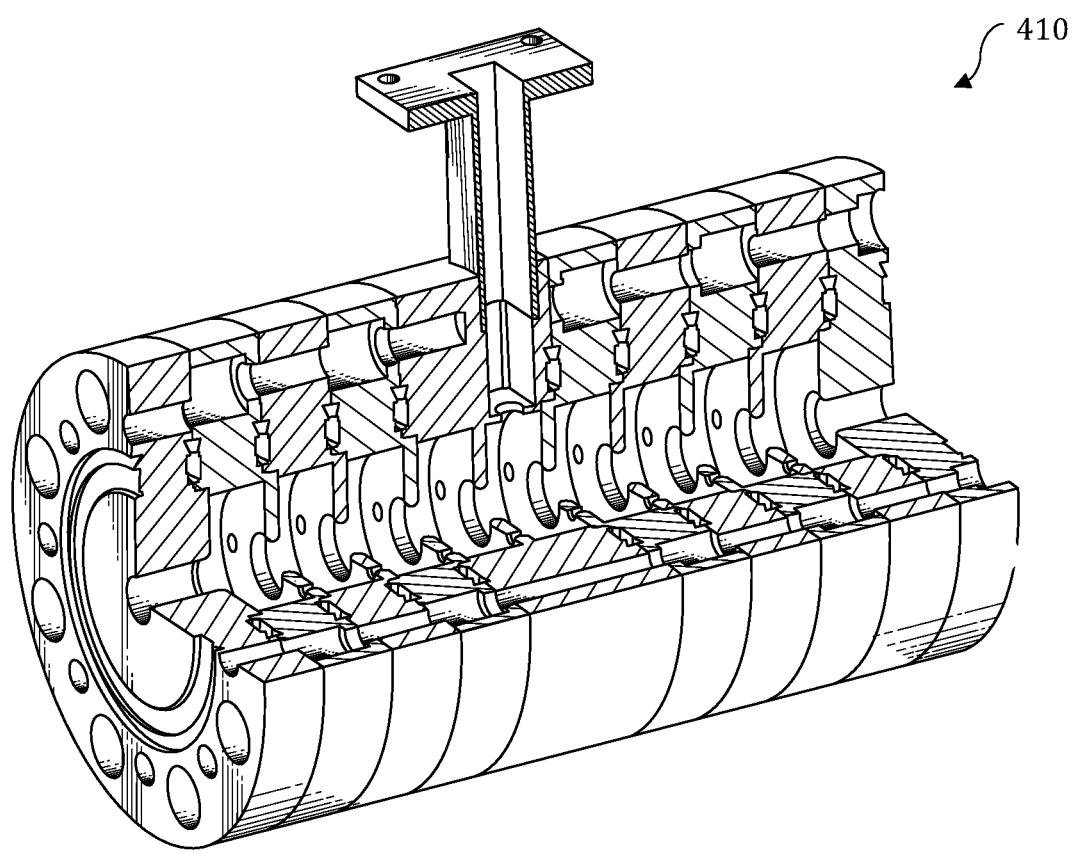
FIG. 4 depicts a perspective cut-away view of RF structures that can form elements of an electron accelerator that can be adapted for use in accordance with a preferred embodiment.

FIG. 4 illustrates a perspective cut-away view of an RF structure 410 that can form elements of an electron accelerator that can be adapted for use in accordance with embodiments disclosed herein. Note that RF accelerator and electron gun structures can be employed to produce electron beams of the required energy for implementation of the disclosed embodiments. An electron accelerator, for example, that employs the RF structure 410 can accelerate electrons generated from an electron gun with RF electric fields in resonant cavities sequenced such that the electrons are accelerated due to an electric field present in each cavity as the electron traverses the cavity to reach a beam extraction device.

Figure 5:
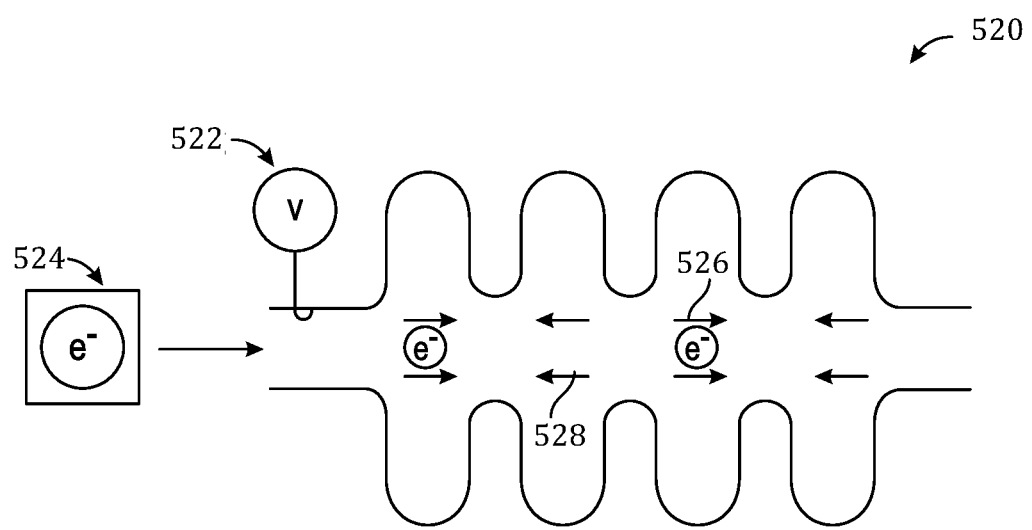
FIG. 5 depicts a perspective cut-away view of a superconducting RF structure that can also form elements of an electron accelerator adapted for use in accordance with an embodiment. The figure indicates the operating principles of such an elliptical RF cavity.

FIG. 5 illustrates a perspective cut-away view of a four cell elliptical superconducting RF structure 520 that can also form elements of an electron accelerator adapted for use in accordance with an embodiment. Note that varying embodiments can employ alternative cavity geometries and/or cell numbers. FIG. 5 generally indicates the operating principles of an elliptical RF cavity. Advancements in SRF technology can enable even more compact and efficient accelerators for this application.

The RF structure 520 of FIG. 5 demonstrates the principle of operation in which alternating RF electric fields can be arranged to accelerate groups of electrons timed to arrive in each cavity when the electric field in that cavity causes the electrons to gain additional energy. In the particular embodiment shown in FIG. 5, a voltage generator 522 can induce an electric field within the RF cavity. Its voltage can oscillate, for example, with a radio frequency of 1.3 Gigahertz or 1.3 billion times per second. An electron source 524 can inject particles into the cavity in phase with the variable voltage provided by the voltage generator 522 of the RF structure 520. Arrow(s) 526 shown in FIG. 5 indicate that the electron injection and cavity RF phase is adjusted such that electrons experience or "feel" an average force that accelerates them in the forward direction, while arrow(s) 528 indicate that electrons are not present in a cavity cell when the force is in the backwards direction.

It can be appreciated that the example RF structures 410 and 520, respectively shown in FIGS. 4-5, represent examples only and that electron accelerators of other types and configurations/structures/frequencies may be implemented in accordance with alternative embodiments. That is, the disclosed embodiments are not limited structurally to the example electron accelerator structures 410, 520, respectively shown in FIGS. 4-5, but represent merely one possible type of structure that may be employed with particular embodiments. Alternative embodiments may vary in structure, arrangement, frequency, and type of utilized accelerators, RF structures, and so forth.

Figure 6:
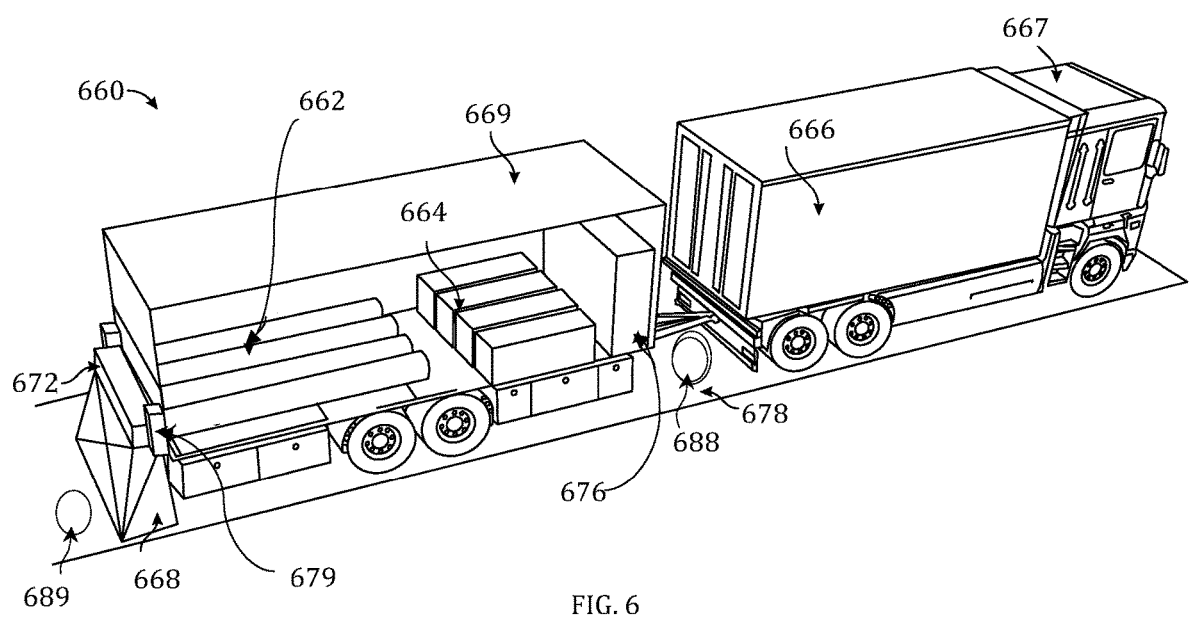
FIG. 6 depicts a system for treating and strengthening a material, in accordance with an embodiment.

FIG. 6 illustrates a system 660 for treating a material, in accordance with a preferred embodiment. System 660 generally includes a mobile unit 669 (e.g., a trailer, etc.) capable of being pulled by, for example, a truck 667 or other vehicle. It should be appreciated that the mobile unit 669 can comprise any transportation device, including but not limited to, a sled, a dolly, a cart, or other such transportation system. In other embodiments, the mobile unit can comprise a driven and/or autonomous vehicle. The truck 667 carries a mobile electrical generator 666. One or more electron accelerators 662 can be disposed within the trailer with respect to one or more RF sources 664. A cooling structure 676 can also be located within the trailer or mobile unit 669 with respect to the RF source 664. In a preferred embodiment, the accelerators 662, RF sources 664, and cooling structure 676 can be integrated with the mobile unit 669.

A shielding 668 can be located at the rear of the mobile unit 669 to enclose electron beams with respect to the electron accelerator(s) 662. In addition, a structure 672 for EB bending and sweeping magnets can also be located at the rear of the mobile unit 669. A mechanism can also be provided to follow the target surface 678 where pattern creation in a material 688 is desired. The electron accelerators 662 can be positioned on the mobile unit 669 to irradiate (e.g. with X-rays, gamma rays, etc.) and treat in-situ, a material 688, in or around, the target surface 678 (e.g., a road surface) where pattern creation is desired, located proximate to the mobile unit 669, wherein irradiation of the material 688 via the electron accelerators 662 results in in-situ polymerization and/or cross-linking resulting in fabrication of a pattern or structure 689 in the target surface 678.

In some embodiments, the material 688 to be irradiated may constitute a polymer or a polymer composite. In other embodiments, such material can be, for example, a bitumen or modified bitumen, or an electron or x-ray cross-link capable bitumen product. In still other embodiments, the material can be, for example, plastic or plastic composite materials or any material capable of being cross-linked or its materials properties modified with electron beams or X-ray or by irradiation of the material to induce in-situ cross-linking or curing of the material. In other embodiments, the material can comprise pre-formed pavement (or other cross-linkable material) tiles, of any shape, such that the tiles can be distributed in a desired pattern and linked together.

In still other embodiments, the material 688 can be, for example, asphalt, modified asphalt, or a cross-link capable binder-stone mixture of a road surface. In a preferred embodiment, material is such a road surface. In general, the mobile unit can be configured as a vehicle-mounted unit that moves above and with respect to the target area in the road surface/material filling. The mobile unit moves with respect to the material filling that is being treated.

In another embodiment, the system 660 can include a mobile electron accelerator 662 that is used to accelerate electrons into the surface of the target area 678 that has material 688. The accelerated electrons rapidly raise the temperature of the repair or fill material (e.g. asphalt) above the melting point of the binder (e.g. bitumen) to a necessary depth below the surface of the repair. This allows a lasting pattern or structure to be made in the target area 678. The technique for imparting a pattern or structure 689 can also be combined with a material that can be electron beam cross-linked to provide extra strength.

One of the key aspects of the disclosed embodiments is based on the realization that the material properties of polymers, for example, can be improved (e.g., strength, toughness, heat resistance, etc.) via cross-linking the material with radiation. The mobile electron accelerators 662 and/or providing the electron beams can provide such irradiation.

When a synthetic polymer is to be "cross-linked," this refers to a process in which a portion of, or the entire bulk of the polymer, has been exposed to the cross-linking method. The disclosed approach exposes the polymer to radiation from the electron accelerator(s). This resulting modification of mechanical properties depends strongly on the cross-link density achieved. Low cross-link densities decrease the viscosities of polymeric fluids. Intermediate cross-link densities transform gummy polymers into materials that have elastomeric properties and potentially high strengths. Additional cross-linking makes the material more rigid and eventually stiff and brittle. Radiation induced polymerization allows in-situ adjustment of such materials' properties.

Numerous polymers can be added to bitumen to create mixtures that, when cross-linked, alter their physical properties. Bitumen mixtures of this type can be cross-linked, usually with the addition of sulfur compounds. In addition, materials can be added to the mixture to provide reflective, colorful, or other cosmetic qualities of the mixture. All such methods can be performed beforehand therefore coupling the handling properties of the materials during fabrication to the eventual properties of the completed item.

The disclosed embodiments, can employ electron beams from mobile accelerators such as, for example, accelerators controlled with a control system, to irradiate material in a specified manner to achieve a desired pattern or structure, by adjusting the properties of the binding materials (e.g., polymer) in-situ, and after formation via radiation induced cross-linking. Such an approach can be used to tailor the final materials' properties to the intended application independent of the materials' properties during formation of the surface. It should be appreciated, however, that such an approach is not limited to road surfaces, and can be adapted for use in irradiating other finished in-place materials to achieve a desired pattern or structure from the material.

The embodiments described herein provide electron beams that are very effective at depositing heat deep (several centimeters or more) into a surface allowing its temperature to be raised to the standard working temperatures for asphalt, even under conditions of extreme winter cold. Electron beam heating described herein does not depend on the thermal conductivity of an asphalt like material, which is typically very poor, to heat subsurface material.

The embodiment depicted in FIG. 6 can be implemented in the context of standard asphalt construction and repair involving the use of gravel and bitumen, or in other fabrication methods. Treatment of a target area is not limited to bulk road repair applications. While pot hole repair, for example, can be achieved, other more nuanced applications may also be desirable. For example, a target area can be selected where a desired pattern or shape may be necessary. The shape or pattern may range from something as simple as ridges or grooves in the surface, to complex three-dimensional structures. Such features can be functional. For example, such features can be selected to increase lateral stiffness, control directional friction, repair damage, or increase draining efficiency.

The desired features to be imparted in or on the target area can be expressed in a two dimensional or three dimensional coordinate system. In the case of a three dimensional system, a series of voxel elements can be defined in the target area. In such an example, the adjacent rows of voxels in the accelerator's direction of travel can define the length of the feature within the target area. Adjacent rows of voxels in the beam scanning direction can define the width of the feature in the target area. The energy of the beam spot can define the vertical dimension of the feature. The accelerator can then be moved through the target area while the beam is scanned across the target area. The duty factor of the accelerator can be adjusted so that each voxel element is properly dosed with the required energy to achieve the desired structure.

Figure 7:
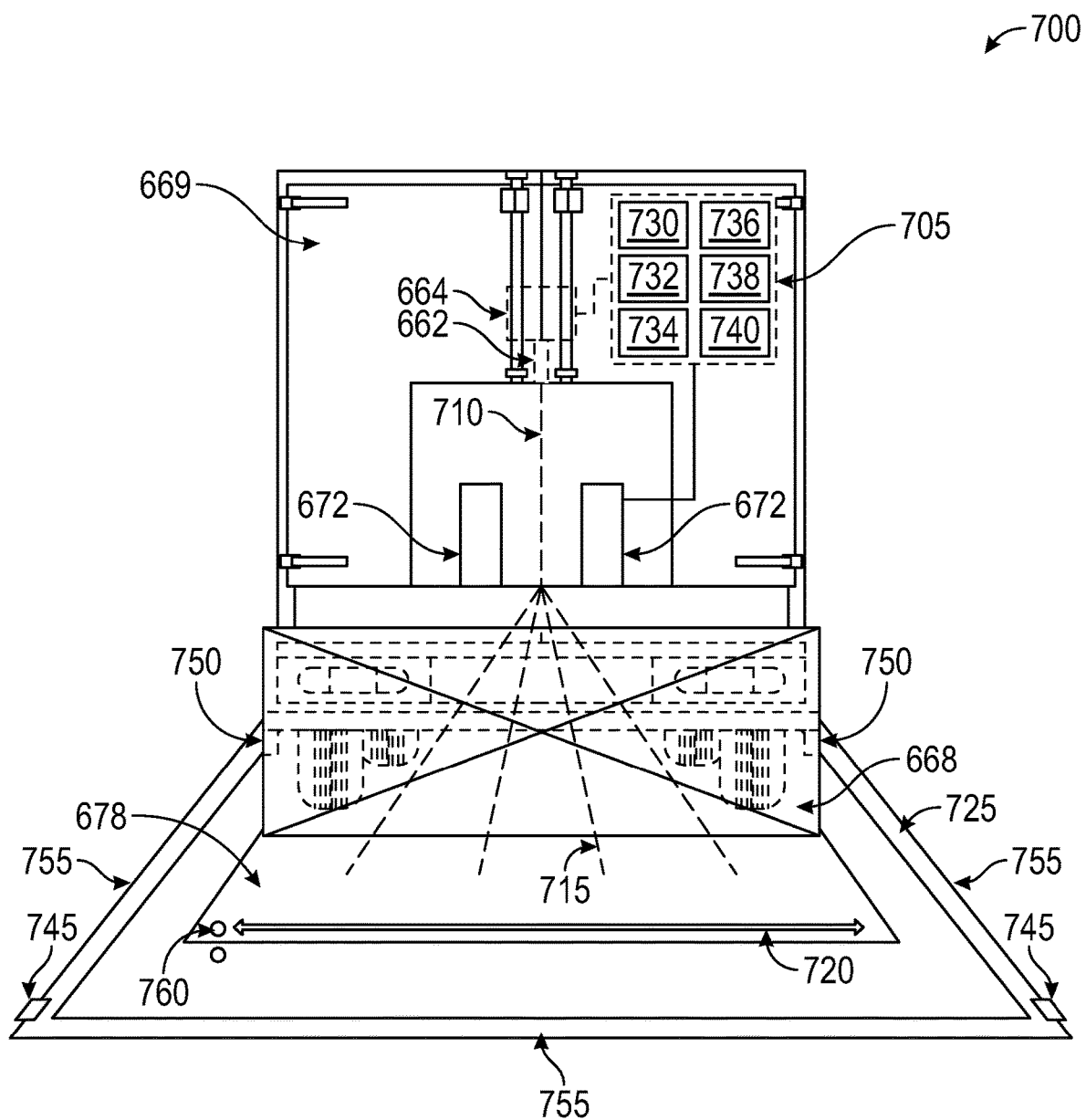
FIG. 7 depicts a system for fabricating structures in accordance with the disclosed embodiments.

FIG. 7 illustrates a system 700 for fabricating structures in a target area 678, in accordance with the disclosed embodiments. In such embodiments, a control system 705 is operably connected to the mobile accelerator assembly and/or the beam bending assembly 672. The control system can comprise a computer system, including a specially configured or special purpose computer system with a series of control modules. The control modules can comprise instructions that can be implemented to control fabrication in accordance with the disclosed embodiments. The operable communication can be achieved via wired or wireless communication over a network, or other such communication mode.

A user interface can be provided that allows the user to control various aspects of designing a feature to be imparted in the surface, and controlling the mobile accelerator. The user interface can also provide the user instructions or notifications as to the control of the mobile accelerator, etc. Thus, the user interface can be provided on a computer system, mobile device, heads-up display associated with a vehicle, or other such device.

The control system 705 includes mapping module 730 which is configured to interface with sensors, such as sensor 750 to generate a map of the target area 678, and/or store a map of the target area 678. The mapping module 730 can operate in conjunction with a discretization module 734 configured to discretize the target area 678 into discrete volumes or voxels. Design module 736 is configured to allow a user to prepare and/or store a desired structural design for the target area 678. A dose module 738 is configured to assign an irradiation dose to each voxel defined by the discretization module 734, according to the design provided by design module 736. Duty factor module 740 uses the speed of the mobile unit 669 to control the duty factor of the accelerator so that each voxel receives the proper dose of irradiation. It should be understood that some or all of these modules can be automatic or can allow a user to define certain parameters, such as fabrication design, fabrication time, mobile unit speed, material characteristics, etc.

It should be appreciated that the duty factor module 740 can adjust the duty factor of the accelerator and/or can adjust the sweep frequency of the electron beam 710 through the electron beam bending assembly 672, to adjust the rate the electron beam 715 is cycled back and forth as illustrated by arrow 720.

The duty factor module 740 can be configured to accept input from on-board sensors such as sensors 750 or external sensors, such as sensors 745. It should be understood that these sensors can comprise, GPS receivers, locations sensors, sonic sensors, position sensors, beacons, image sensors, and the like. External sensors 745 can be positioned around the target area 678, and serve to provide the control system 705 reference location information on the location of the accelerator and/or the target area 678. It should be appreciated that location information may also be provided via a GPS system, aerial drone system, or other such system.

For example, localization of the accelerator with respect to its target may be achieved using both active and/or passive beacons 745 placed in or around the target area 678 with sensors 750 aboard the mobile accelerator. In certain embodiments, physical barriers 755 may be erected such that the mobile unit 669 changes direction when encountering the barrier 755. A barrier encounter could be physical (e.g. the mobile unit 669 contacts the barrier) or virtual (e.g. a sensor aboard the accelerator recognizes physical proximity to a virtual or actual barrier 755).

In certain embodiments, the system, using beacons 745 to provide barrier functionality (i.e. to confine the accelerator to a specific area) as well as provide accelerator localization, can be combined with an autonomously-driven mobile unit 669, configured to impart specific irradiation values to specific voxel elements. The mobile unit 669 can create specific designs by traveling an arbitrary or optimized path through the target area 678. The control system 705 can be programmed to traverse the space until all voxel elements have been treated according to the design created with the design module 736. The path can be optimized, or can follow a pre-defined pattern, such as raster, spiral, or wall-following pattern.

In a simple example embodiment, where pothole filling is desired, the features of a roadway with one or more potholes can be mapped. The mapped roadway, and the identified potholes, can be discretized into voxel elements. Cross-linkable material 688 can be inserted into the pothole(s). The mobile unit can then be moved along the roadway over the pothole(s).

The control system 705 can be used to control irradiation of each voxel of the pothole with cross-linkable material 688 therein, and potentially, proximate areas surrounding the pothole, to encourage cross-linking between the cross-linkable material and the existing roadway. The proximate area can be a predetermined distance (e.g. 2 inches surrounding the pothole circumference) or can be defined by the user. The voxels can be irradiated with the predefined dose provided by the dose module such that the cross-linkable material 688 (and potentially, the surrounding roadway) is irradiated. In such an embodiment, a significant portion of the roadway will not be irradiated (i.e. will be assigned a 0 value for irradiation) because it is not related to the pothole, or other such area of interest.

This embodiment not only crosslinks the filler material and surrounding pavement, but also provides more penetrating heat to the filler material and surrounding pavement areas. The provision of heat as well as crosslinking are characteristic of the exemplary embodiment. Thus, the pothole in the roadway can be repaired in this manner, even in extreme cold conditions, where prior art pothole repair methods fail. It should be appreciated that the same basic approach can be used on much larger target areas (e.g. a highway, roadway, overpass, bridge, building pad, construction site, etc.) where more specialized design parameters are desired.

In certain embodiments the cross-linkable material 688, which is intended to be targeted by the particle beam, can contain a tracer element 760. An exemplary tracer element 760 can be a unique color or reflective, such that it can be detected by a low-cost sensor (e.g. sensor 750) mounted on the mobile unit 669. In such embodiments, the sensor 750 can be fixed on the mobile unit 669 a known distance ahead of the beam outlet. The sensor 750 can detect the tracer element 760. A signal indicative of the detection of the tracer element 760 can be provided to the control system 705 to signify the presence of filler material 688. The control system can then correctly activate the accelerator so that the beam outlet traverses the target area according to the user defined irradiation value necessary for fabrication of the desired structure. It should be appreciated that tracer element 760 can include one or more of magnetic particles embedded in the material, colorful particles embedded in the material, and reflective particles embedded in the material.

Figure 8A:
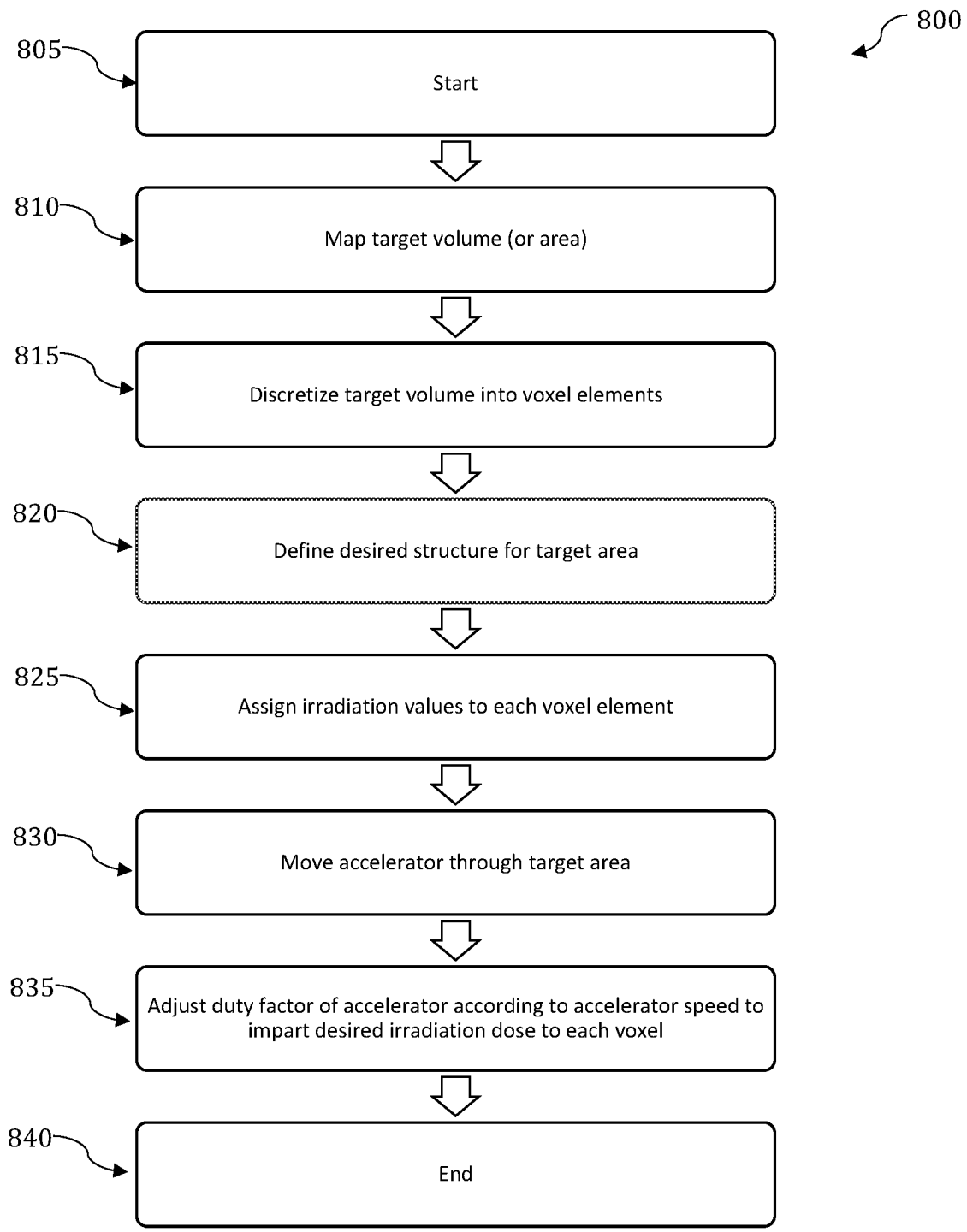
FIG. 8A depicts a method for fabricating structures in accordance with the disclosed embodiments.

FIG. 8 illustrates a flow chart of steps associated with a high level method 800 for fabricating a structure using the systems disclosed herein, in accordance with the disclosed embodiments. The method begins at 805. It should be appreciated that the order of the steps illustrated in method 800 are exemplary but could be implemented in alternative orders according to design considerations.

A first step in the method is to select and map the target area (or volume) as illustrated at step 810. Mapping of target topography can be accomplished in any number of ways. In certain embodiments, historical records or modern surveying methods can be used. Mapping target topography can be achieved with a surveyor's "traverse," whereby target (e.g. land, road, build platform, etc.) positions are assigned to a plane coordinate system. Other direct survey techniques which utilize position points, angle measurements, and distances between them can also be used.

Passive sensor methodologies may be utilized to map the target area, which can make use of aerial or satellite imagery to delineate terrain features. Photogrammetry, whereby two or more photographic images taken from different angles expose the three-dimensional positions of common features are "triangulated" from the intersection of rays, can be used to map target features. Other technologies such as RADAR (Radio Direction And Ranging) and LIDAR (Light Detection And Ranging) techniques may be employed to map the target topography.

In other embodiments, drone systems, or other remote sensing techniques can be used to map the target topography. Other techniques include satellite or aircraft-borne sensor techniques.

Once the target area is adequately mapped, the next step 815 is to discretize the target area or volume into voxel elements with accompanying position values (e.g. GPS values, or other spatial values). This may be most easily achieved with a computer system, but other value assignment techniques can also be used.

The desired structure to be fabricated in, or on, the target area can next be defined as illustrated at 820. As previously noted, the desired structure can range in complexity and purpose. In some cases, the desired structure may be as simple as a pothole fill, or warning grooves or bumps formed in the edge of a roadway. In other embodiments, complex two or three dimensional structures can be selected, including but not limited to, patterns to improve road traction, improve drainage, create varying sounds or tones, and the like. In still further embodiments, the target area may not be a roadway. In such cases, the target area can comprise a manufacturing bed where fabrication of complex three-dimensional structures is desired.

At step 825 irradiation values can be assigned to each voxel element in the target area according to the desired structure to be fabricated. The irradiation values can be assigned to each voxel element with the computer system, or by other means. Irradiation values for any given voxel will vary according to the level of cross-linking necessary to impart the desired structure. Thus, the irradiation values will range from 0 to essentially any value greater than 0.

At this stage, the target area has been discretized into voxel elements and each of those voxel elements has been assigned a specific irradiation value necessary to fabricate the desired structure in the target area. At step 830 the accelerator can begin an initial pass over, or through, the target area. As the accelerator progresses through the target area, the electron beam can be swept, most commonly perpendicularly to the direction of motion of the accelerator, although other sweep patterns or shapes are also possible. According to the scaling described herein, the duty factor of the accelerator can be adjusted according to the accelerator speed so that each voxel is properly dosed. Specifically, if the accelerator is moving slowly the control system will adjust the duty factor of the accelerator so that each voxel receives the required irradiation. If the accelerator is moving faster, the accelerator will require a comparatively high duty factor. Thus, the control system can use the speed of the accelerator, and other such factors, to adjust the duty factor of the accelerator as shown at 835.

It should be understood that, in certain cases, the target area may exceed the width of the electron beam sweep, and/or certain voxels in the target area may require additional irradiation. In such cases, the accelerator may make multiple passes over or through some or all of the target area to achieve the desired irradiation of each voxel.

In other embodiments, the target area can be very precisely targeted with a single pass. It is an aspect of the disclosed embodiments to provide methods and systems for reducing occupational exposure to the particle beam by precisely targeting the materials to be irradiated, as illustrated in the method 800, rather than uniformly irradiating a material without regard to necessity. Irradiating only the materials that require irradiation (e.g. a pothole filled with filling material, instead of the entire roadway) dramatically reduces use of the beam and is consistent with "ALARA" principles of radiation safety to keep potential radiation doses "As Low As Reasonably Achievable." This can significantly reduce the radiation dose to which the operator (e.g. a road worker) is exposed.

In still other embodiments, after a first pass, new material can be deposited in some or all of the target area, and the accelerator can make an additional pass over the newly added material, resulting in the fabrication of multiple layers of a desired two or three dimensional structure. The method ends at step 840 when the desired structure has been fabricated.

Figure 8B:
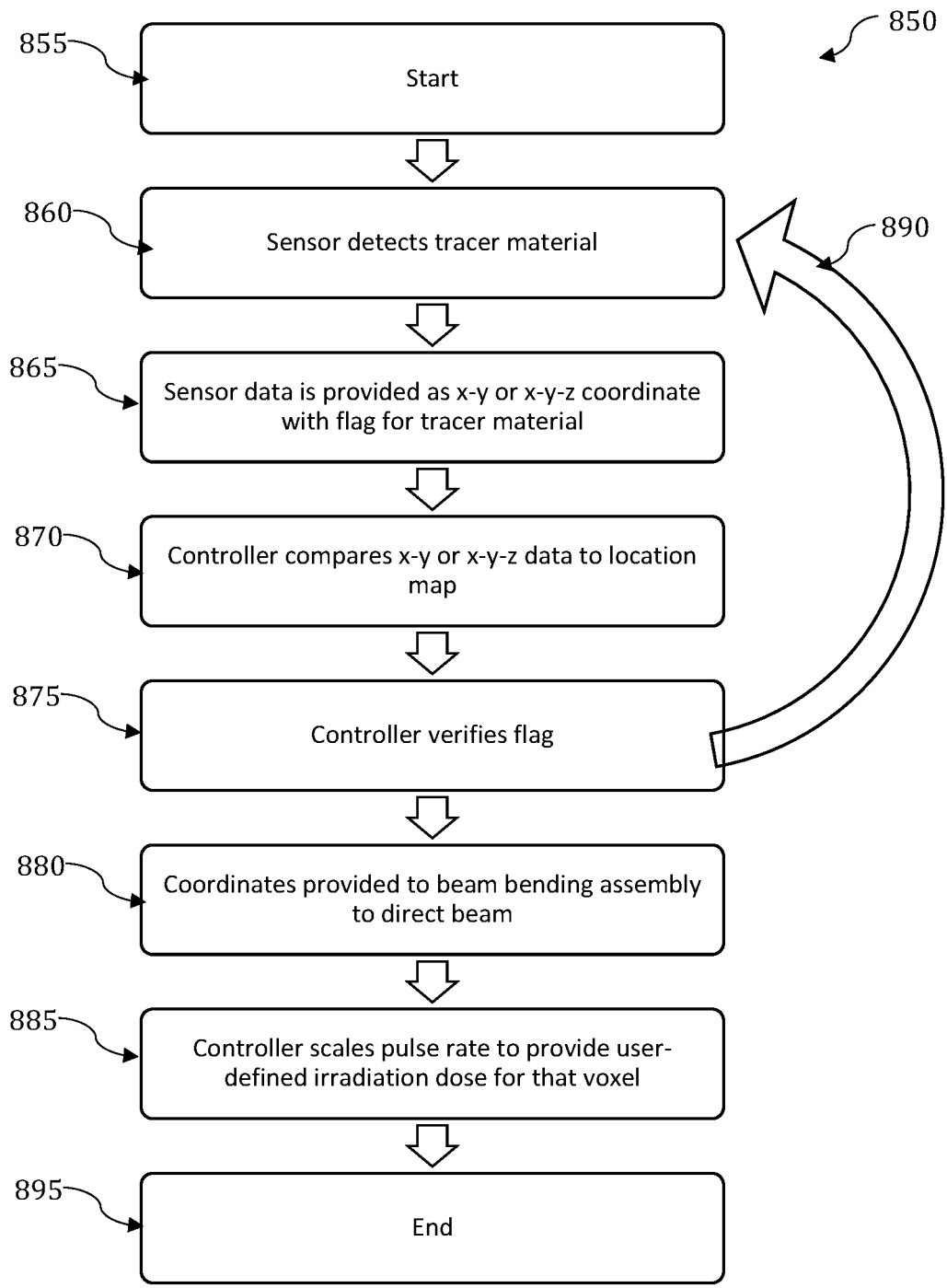
FIG. 8B depicts a method for fabricating structures in accordance with the disclosed embodiments.

FIG. 8B illustrates a method 850 for processing sensor data in accordance with the disclosed embodiments. The method begins at 855. At step 860, one or more of the sensors associated with the mobile unit detect the tracer material inserted in the cross-linking material.

Upon detection of the tracer material, at step 865, the sensor data can be provided as location data (i.e. cartesian coordinates in one or more dimensions) to the controller. In addition, the tracer material can trigger a "flag" in the controller indicating that the tracer material has been identified. The controller can then compare the location collected by the sensor to the map data of the target volume, as illustrated at 870.

At step 875 the controller can verify the flag, based on the sensor detection and the stored map data associated with the target volume. Once the controller verifies that the sensor has correctly identified a target volume with the tracer material, at step 880, the coordinates of the location where the tracer material was identified can be used by the controller to adjust the beam bending assembly, so that the beam bending assembly can irradiate the target area where the tracer has been identified. At step 885, the controller can also scale the pulse rate of the accelerator to provide the correct dose of irradiation for the identified voxel with the tracer material.

It should be noted that this method can be continuously implemented such that the sensors notify the controller anytime a tracer material is identified, as illustrated by arrow 890. In this way, the controller can use detection of the tracer material to correctly irradiate one or more target locations in at or near real time, as the mobile unit passes over the target. The method ends at 895.

A critical aspect of the system is the beam bending assembly, which plays a crucial role in defining the width and shape of the beam scan. The beam bending assembly 672 can be controlled so that the desired pattern is imparted on the target surface. The beam bending assembly can be embodied in variety of ways. In some embodiments, the beam bending assembly can comprise a set of one or more bending magnets 672, configured to bend the beam 710 along a predefined scanning direction, generally perpendicular to the motion of the mobile unit 669, although other beam scanning patterns are possible. In other embodiments, the beam bending assembly can comprise an electromagnet, or deflection coil, configured to bend the beam 710. The control system can adjust the orientation of the beam bending assembly and/or the associated magnetic field to achieve other more complex beam bending patterns, or to spot treat one or more specific locations in the target area.

For example, in one embodiment, the accelerator is advanced in a desired direction along a surface. The magnet (e.g. an electromagnet) serves to sweep the beam in a direction perpendicular to that of the accelerator, thereby defining the width of the scan pass. In certain embodiments, the electron gun can be switched on and off at precisely defined intervals (i.e. a desired duty factor) to impart the desired irradiation to each voxel.

In other embodiments, a more sophisticated beam bending assembly than 672 can include evacuated beam tubes, and beam bending magnets, with a beam extraction window, configured with rotatable vacuum seals. In this assembly, the beam can be directed via the beam bending magnets such that an arbitrary pattern of high energy charged particles can be delivered from the particle accelerator to a desired target volume.

Figure 9:
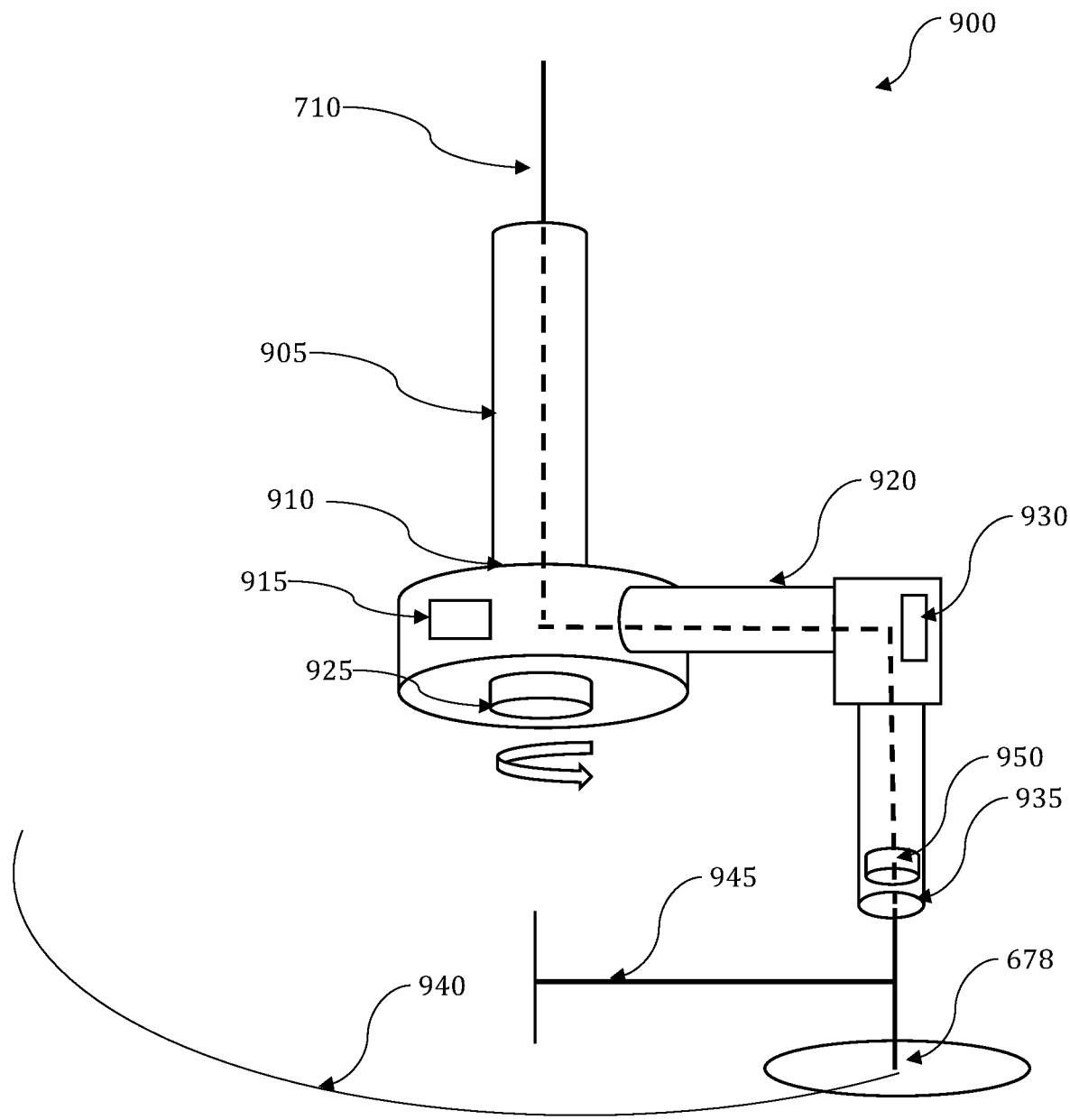
FIG. 9 depicts a beam bending system in accordance with the disclosed embodiments.

In one such embodiment a snout 900 as illustrated in FIG. 9, can be employed. In such an embodiment, the particle beam 710 arrives vertically in a downward direction in an evacuated beam transport tube 905, and passes through a rotatable vacuum seal 910. The rotatable vacuum seal 910 can include a bending magnet 915.

The bending magnet 915 bends the beam 710 into a substantially horizontal evacuated beam tube 920 with a horizontal orientation in reference to the evacuated beam transport tube 905. The evacuated beam tube 920 can rotate about the axis of the downward traveling particle beam 710. The evacuated beam tube 920 extends a given length 945 from the center of rotation of the rotatable vacuum seal 910. This length 945 thus defines the width of the "scan pass". Specifically, the "scan pass" is twice the length 945 of the evacuated beam tube 920 since the evacuated beam tube 920 length 945 is the radius of the circle through which the evacuated beam tube 920 can be rotated. It should be understood that the "scan pass" can include a pass, or sweep of 0-360 degrees along beam arc 940.

Rotation of the evacuated beam tube 920 can be controlled by control system 705, and realized with a mechanical drive 925, such as a motor, that is configured to rotate the evacuated beam tube 920 according to signals provide by the control system 705. In certain embodiments, the evacuated beam tube 920 can be rotated at a constant speed. In such a case the rotational speed can be determined according to the pulsing rate of the accelerator (i.e. duty factor). It should be understood that the rotational speed may be relatively slow compared to the scanning speed of other embodiments. However, by pulsing the accelerator (duty factor) a wide range of irradiation doses can still be achieved, with the added advantage that the control system 705 is only required to control duty factor, when the rotational speed is constant.

The particle beam 710 transverse the horizontal beam tube 920 and then is bent downward by a second bending magnet 930. A target 950 can be placed at the end of the movable snout 900 that can convert the electron beam 710 to a beam of gamma-rays, x-rays, etc. to create the desired pattern. The beam 710 then exits via a beam window 935 and impinges on the desired target 678.

The snout 900 can impart arbitrary patterns of beam irradiation along a beam arc 940. Using the snout 900, a desired pattern can be achieved via variation of the rotation angle of the horizontal beam tube 920, and/or on-off modulation of the beam 710, coordinated with the rotation angle. In another embodiment, the control system 705 can further control beam delivery via modulation of the beam 710 energy, and/or the field strength of the bending magnet 915, and/or bending magnet 930.

For example, when the control system includes control of beam energy, field strength of the bending magnets, on-off modulation of the beam, horizontal angle of the beam tube, and speed of mobile unit 669 with respect to the target volume, very precise patterns of material 688 irradiation in the target area can be achieved. Such patterns may be useful for manufacturing scenarios requiring complex patterns of irradiation like radiation induced cross-linking, medical sterilization, waste treatment, and in situ applications utilizing a mobile accelerator.

Figure 10:
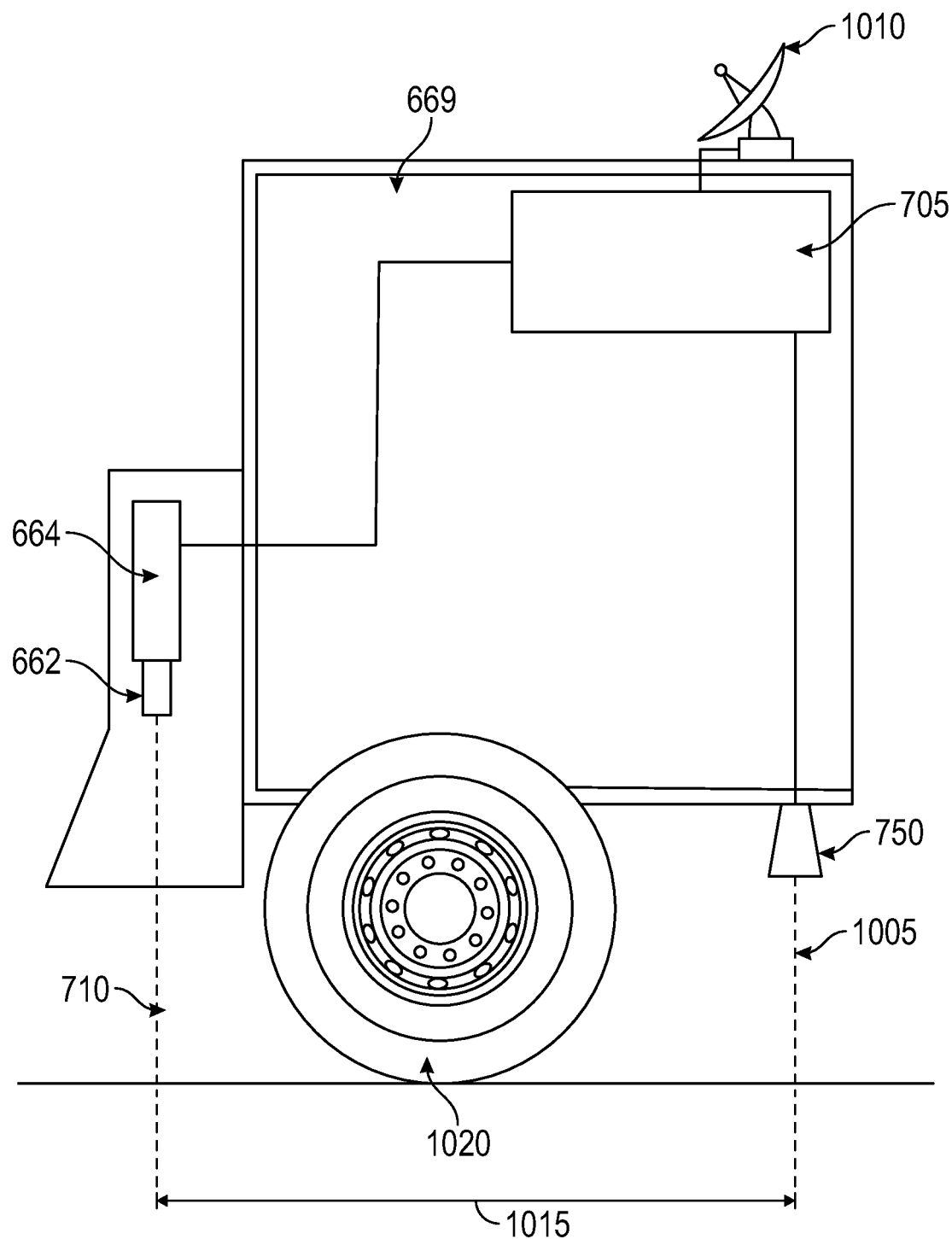
FIG. 10 depicts a system for controlling duty factor in accordance with the disclosed embodiments.

FIG. 10 illustrates an embodiment, of a system for managing the duty factor and/or beam location according to the speed of the mobile unit 669. The mobile unit 669 can include one or more position sensors 750, and/or a GPS receiver 1010.

In an embodiment, the position sensors 750 can collect position data 1005 indicative of a location of features on the surface over which the mobile unit 669 is passing. The beam 710 output from the accelerator 662 and RF sources 664 can be a known distance 1015 from the sensor 750. The sensor 750 can provide data to the control system 705, which can in turn adjust the duty factor of the accelerator 663 according to the data collected by the sensor 750.

In another embodiment, the location, speed, and acceleration of the mobile unit 669 can be recorded by a GPS unit 1010. The GPS unit can provide such data to the control system 705. In such embodiments, the control system 705 can be prepared with a desired structural design for the target area 678, and an irradiation dose assigned to each voxel. Alternatively, or in addition, the position sensor 750 can collect data as the mobile unit 669 passes over the underlying surface, and the necessary irradiation dose can be determined at, or near, real time. In both cases, the control system can adjust the duty factor of the accelerator 662 according to the data collected from the GPS unit 1010 and/or the position sensor 750.

In general, if the mobile unit 669 is moving faster, the duty factor of the accelerator 662 will increase in order to sufficiently dose each voxel in less time. By contrast, if the mobile unit 669 is moving slower, the duty factor of the accelerator 662 can decrease in order to properly dose each voxel. In certain cases, the speed of the mobile unit 669 can be adjusted, instead of, or in addition to, adjustment of duty factor of the mobile accelerator 662, in order to ensure the proper dose of irradiation is applied to each voxel. In certain cases, a driver of the mobile unit can be provided a real time speed target, necessary to properly dose each voxel. In other embodiments, the speed of the mobile unit can be controlled autonomously by the control system 705.

In yet another embodiment, the speed of the mobile unit 669 can be used to adjust the duty factor of the accelerator 662. In such cases, the speed of the mobile unit 669 can be collected with an onboard speedometer, or other such device. The speed of the mobile unit 669 can be provided to the control system 705. The control system 705 can be preloaded with a desired structural design for the target area 678, and an irradiation dose assigned to each voxel, and/or the position sensor 750 can collect data as the mobile unit 669 passes over the underlying surface, and the necessary irradiation dose for each voxel can be determined at, or near, real time. The control system 705 can use the speed of the mobile unit to adjust the duty factor of the accelerator so that the requisite dose of irradiation is applied to each voxel.

In an embodiment, the systems and methods disclosed herein can be used to render three dimensional objects. Such embodiments can include systems and methods for additive manufacturing of objects of varying size and shape. For example, some embodiments can include extreme-scale additive manufacturing applied over large swaths of terrain.

Figure 11:
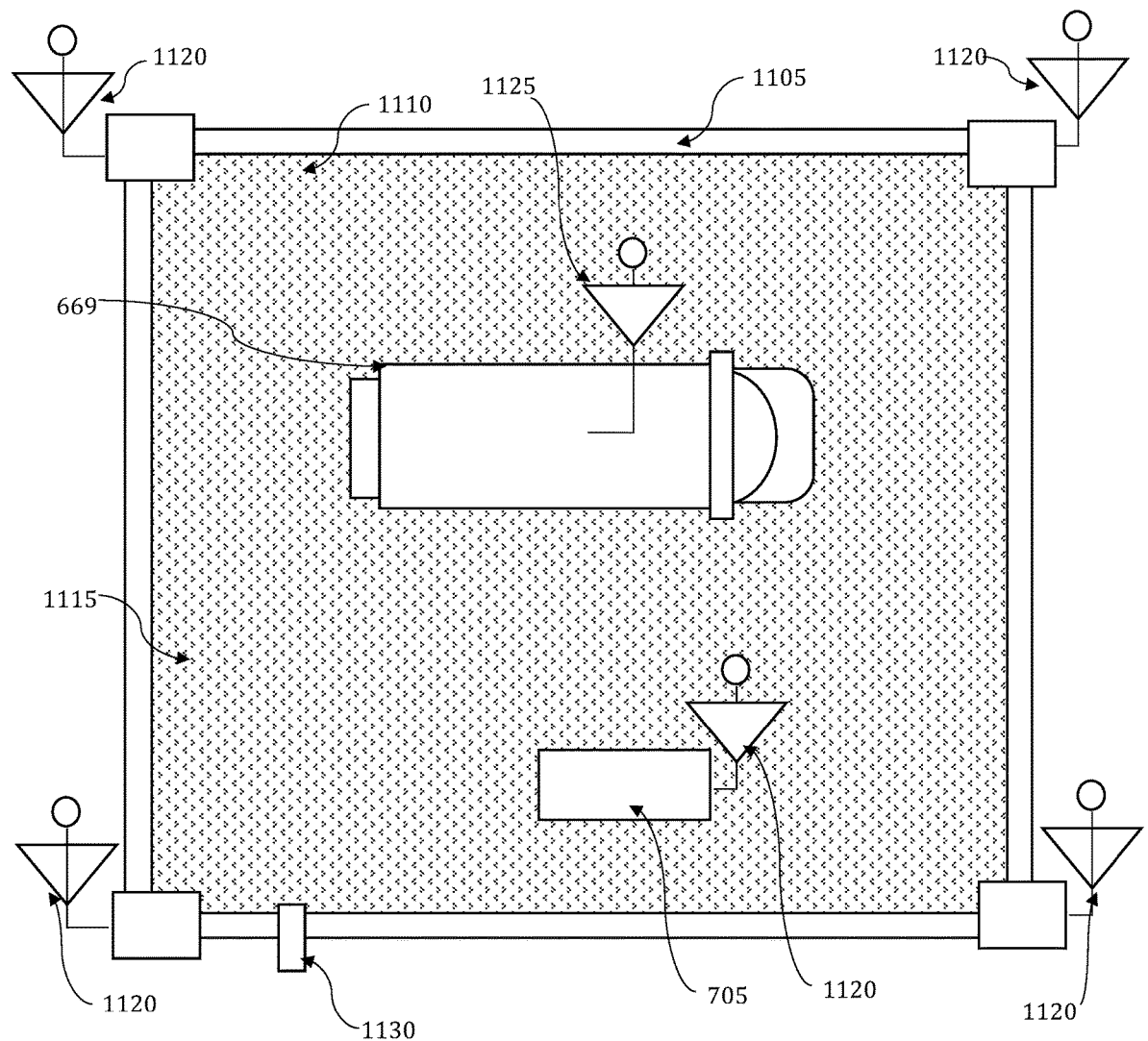
FIG. 11 depicts a system for fabricating three-dimensional structures in accordance with the disclosed embodiments.

In one such embodiment, illustrated in FIG. 11 a physical barrier 1105 can be placed around a construction location 1110. In certain embodiments, the construction location 1110 can be excavated or raised as necessary for the desired project. Cross-linkable liquid 1115 can be poured into the construction location 1110, and a mobile unit 669 can pass through or over the construction location 1110. The mobile unit accelerator can irradiate select locations in the construction location 1110 with the required irradiation dose. The location and dose of each voxel in the construction location 1110 can be defined according to a three dimensional design provided to the control system 705.

Position sensors 1120 can be situated along the barrier, and/or in the construction location. Additional position sensors 1125 can be provided on the mobile accelerator. It should be appreciated that the position sensors 1120 and position sensors 1125 can comprise GPS receivers, image sensors, sonic sensors, beacons, location sensors, or other such sensors as disclosed herein. The sensors can be used to accurately determine the location of the beam in the construction location 1110. The control system 705 can use this information to control one or more of the position of the mobile unit, the duty factor of the accelerator, and/or the speed of the mobile unit, such that a layer of the three dimensional design is realized.

Once a layer of the three dimensional design is complete, the remaining cross-linkable liquid 1115 can be drained away, for example through drain 1130, and a new layer of cross-linkable liquid can be introduced in the construction location 1110. The process can be repeated multiple times to build multiple layers of a three dimensional structure, until the desired three dimensional structure is completed.

Figure 12:
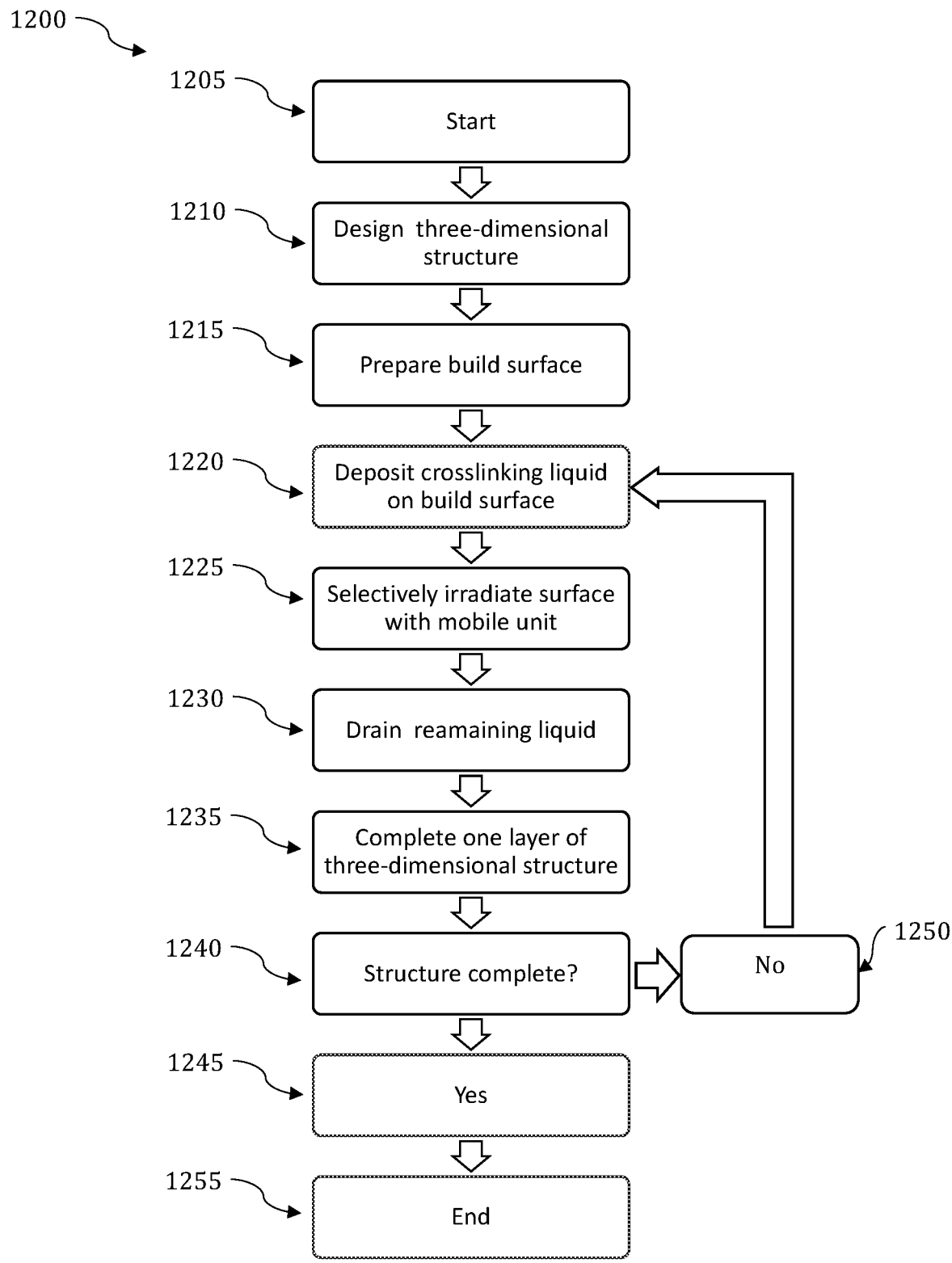
FIG. 12 depicts a method for fabricating three-dimensional structures in accordance with the disclosed embodiments.

FIG. 12 illustrates a method 1200 for fabrication of three dimensional structures in accordance with the disclosed embodiments. The method begins at 1205.

At 1210, a three dimensional structure can be designed. Features may be designed from scratch using a computer system assuming an arbitrary target surface or according to a specific target surface. Voxels of the design may be assigned irradiation values as well as actual 2D or 3D dimensions. The desired dose for each voxel will be imparted to the target surface via the mobile accelerator. At 1215, the target surface can be prepared for fabrication. In some cases, this can include any of, excavating some or all areas of the surface, building mounds or other terrain features in the surface, securing a barrier around the target surface to contain cross-linking liquid, leveling the surface, sloping the surface, etc.

The completed build surface can be covered with (or filled with) cross-linking material as illustrated at 1220. The mobile unit can then traverse the build surface to selectively irradiate locations in the build surface with the required irradiation dose. The location and dose of each voxel of the build surface can be defined according to the three-dimensional design provided to the control system. The mobile unit can be driven through the build surface by an operator, can be remotely controlled by an operator, or can be autonomously controlled by the control system. The mobile unit can follow a pre-defined path, a random path, a most efficient path, or a raster type path, through the build surface. Likewise, the accelerator's duty factor can be controlled according to the motion of the mobile unit as detailed above. Position sensors can be situated along the barrier, and/or in the build surface and additional position sensors can be provided on the mobile unit. The sensors can be used to accurately determine the location of the mobile unit in the construction location in order to control one or more of the position of the mobile unit, the duty factor of the accelerator, and/or the speed of the mobile unit.

Once the mobile unit has completed a pass over and/or through the build surface, the remaining cross-linkable liquid can be drained away or otherwise removed from the build surface at 1230. At this point, a single layer of the desired three-dimensional structure is complete, as illustrated by 1235.

The process can be iterated according to decision block 1240. If the structure has not been completed as indicated at 1250, the process is repeated from step 1220 where additional crosslinking liquid is deposited on the build site. If the desired three dimensional structure has been completed, as shown at step 1245, the fabrication of the desired three-dimensional structure is done, and the method ends at 1255. It should be understood that the method 1200 can be accomplished using one or more of the systems illustrated herein.

Figure 13A:
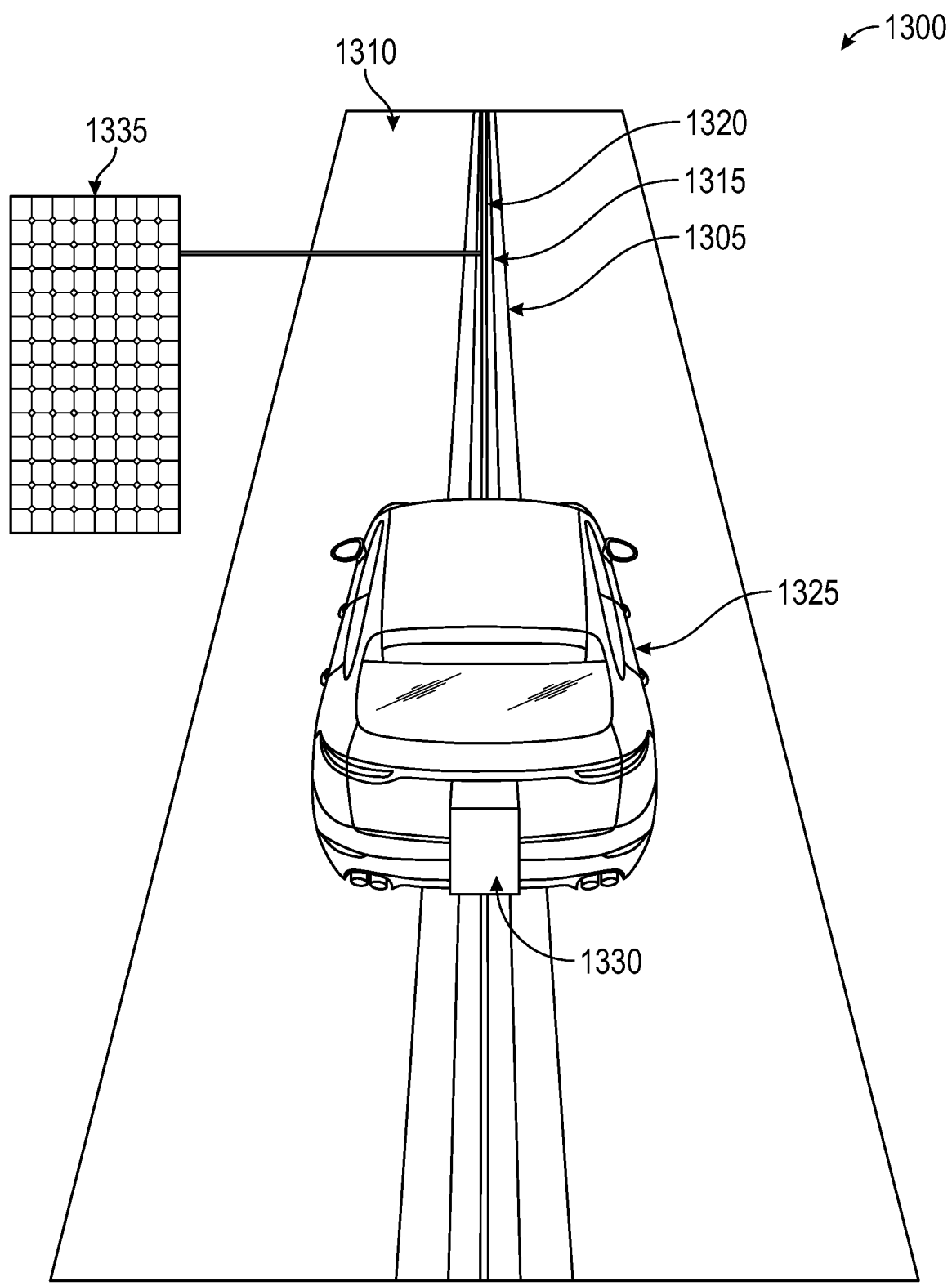
FIG. 13A depicts an electrified road in accordance with the disclosed embodiments.

In an embodiment, the methods and systems disclosed herein can be implemented in the fabrication of electrified roads. Electrified roads provide numerous advantages for electric vehicle technology, by providing power to a vehicle as it travels along a roadway. In some embodiments, the electrified road can be realized by inserting a charging rail in a conduit formed in the road. FIG. 13A illustrates an electrified roadway system 1300 in accordance with the disclosed embodiments. As illustrated, a channel 1305 is cut in a roadway 1310. A conduit 1315 can be inserted in the channel, and an electric rail 1320 is installed in the conduit 1315. The electric rail can be connected to an external power source 1335, such as solar collectors, wind generators, batteries, the existing power grid, a power plant, etc. An electric vehicle 1325 can be equipped with a coupler 1330 that contacts the electric rail 1320, and draws a charge, such that batteries and/or the motor associated with the electric vehicle 1325 receives power.

Figure 13B:
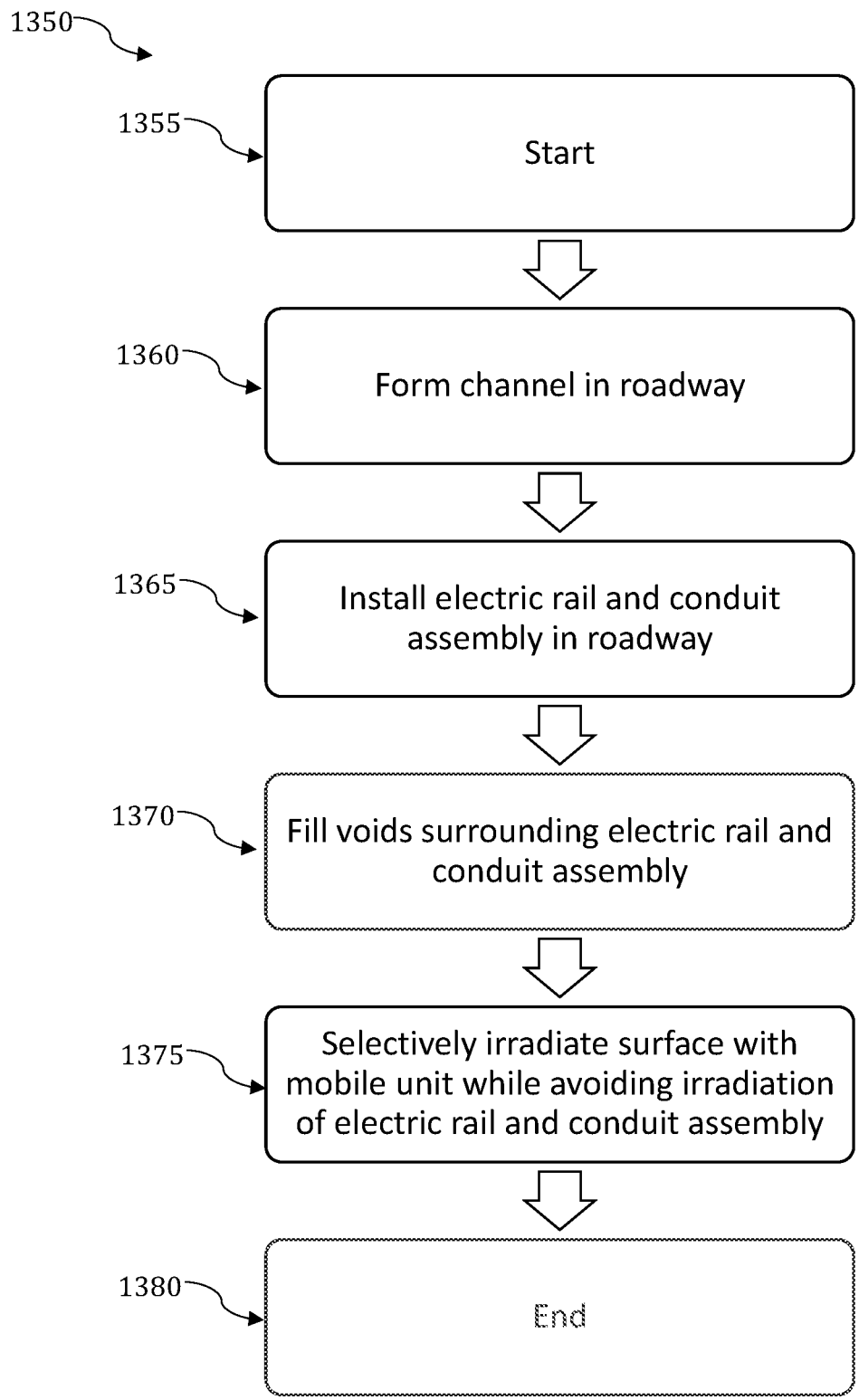
FIG. 13B depicts a method for fabricating an electrified road in accordance with the disclosed embodiments.

FIG. 13B illustrates a method 1350 for constructing an electrified road in accordance with the embodiments disclosed herein. The method begins at 1355. At 1360, a channel can be formed in a roadway. In some cases, this can comprise forming a new roadway, with a channel therein, or can comprise removing material from an existing roadway to form the channel. At 1365, an electric rail and conduit assembly can be installed in the channel. Voids surrounding the electric rail and conduit assembly can next be filled at step 1370. The void can be filled with cross-linkable material, as described herein.

At step 1375, the cross-linkable material can be irradiated according to the methods and systems disclosed herein. It is important to note that this step can include a "tagging" process. The tagging process includes irradiating cross-linkable material, while strictly avoiding any irradiation of the electric rail and conduit assembly. This can include identifying the electric rail and conduit assembly based on characteristics such as, reflectivity of the rail, color of the rail, etc. Tagging can include either an instruction to irradiate the subject voxel element (because it has been identified as cross-linkable material) provided by the control system, or an instruction not to irradiate the subject voxel element (because it is a part of the electric rail and conduit assembly) provided by the control system. Tagging can thus include using sensors to identify the rail assembly. When the rail assembly is identified, the control system associated with the accelerator can adjust one or both of the duty cycle of the accelerator and the location of the accelerator beam, to ensure the cross-linkable material is irradiated but the electric rail and conduit assembly is not. The method ends at 1380.

Treatment, according to the method 1350, of the material surrounding the electric rail and conduit assembly makes the electrified roadway more resilient. This is important because it is more expensive to construct sections of electrified roadways than typical roadways. Thus, extending the life of electrified roadways, even by relatively short amounts of time, yields significant cost savings for the roadway life-cycle.

Figure 14A:
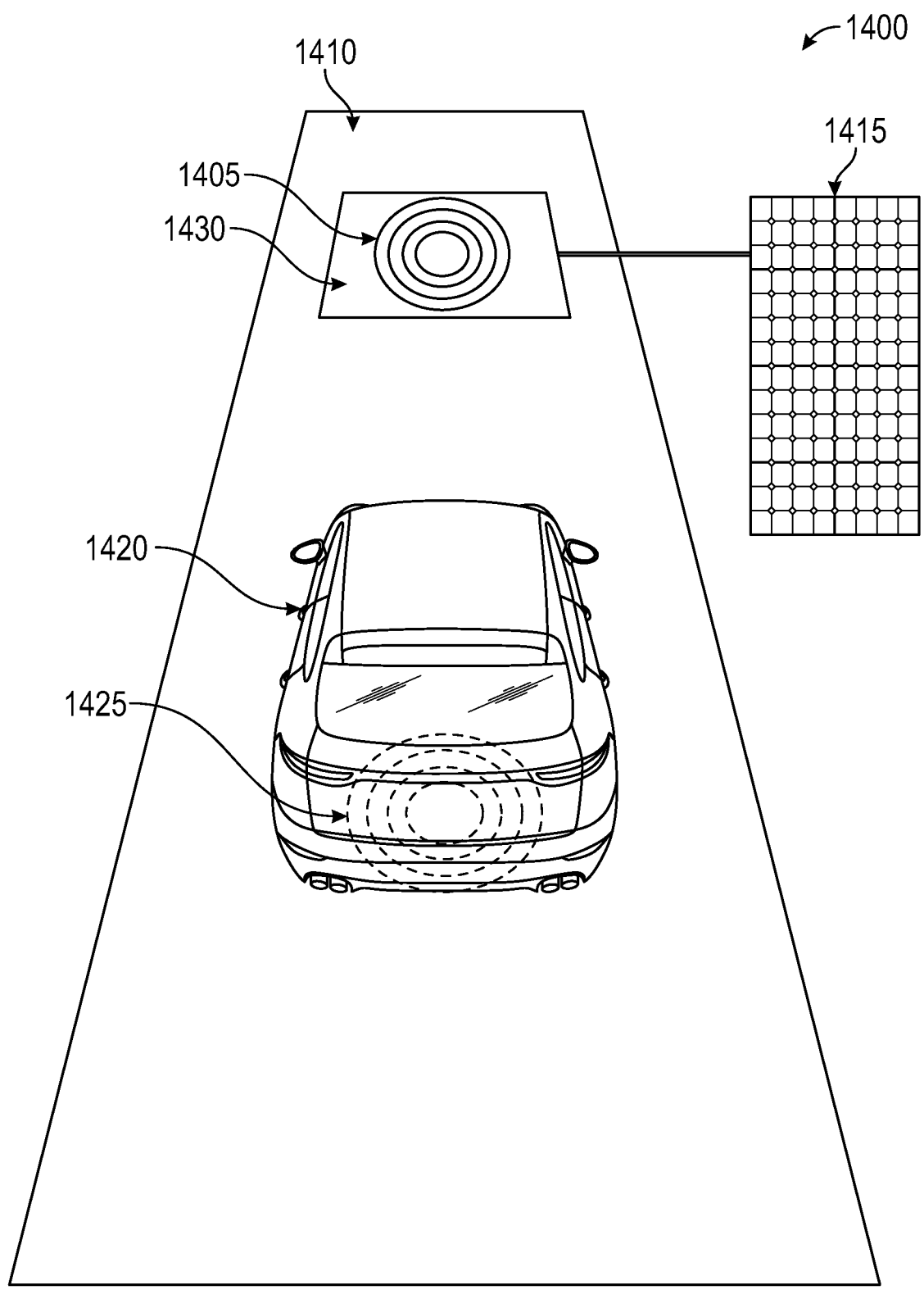
FIG. 14A depicts an induced electrified road in accordance with the disclosed embodiments.

In another embodiment, the electric roadway can be constructed using induction coils embedded in the roadway. FIG. 14A illustrates an inductive charging roadway system 1400 in accordance with the disclosed embodiments. The inductive charging roadway system 1400 includes one or more inductive coils 1405 embedded in, and buried completely (or partially) beneath the road surface 1410 in a void 1430. The inductive coil(s) 1405 can be connected to an external power source 1415, such as solar collectors, wind generators, batteries, the existing power grid, a power plant, etc.

Inductive electric vehicle 1420 traveling along the road can include one or more inductive coils 1425. The induced electromagnetic field created by the inductive coil(s) 1405 induces a current in the inductive coil 1425, as the electric vehicle 1420 passes. The induced current can be used to charge batteries and/or provide current to the motor associated with the inductive electric vehicle 1420.

Figure 14B:
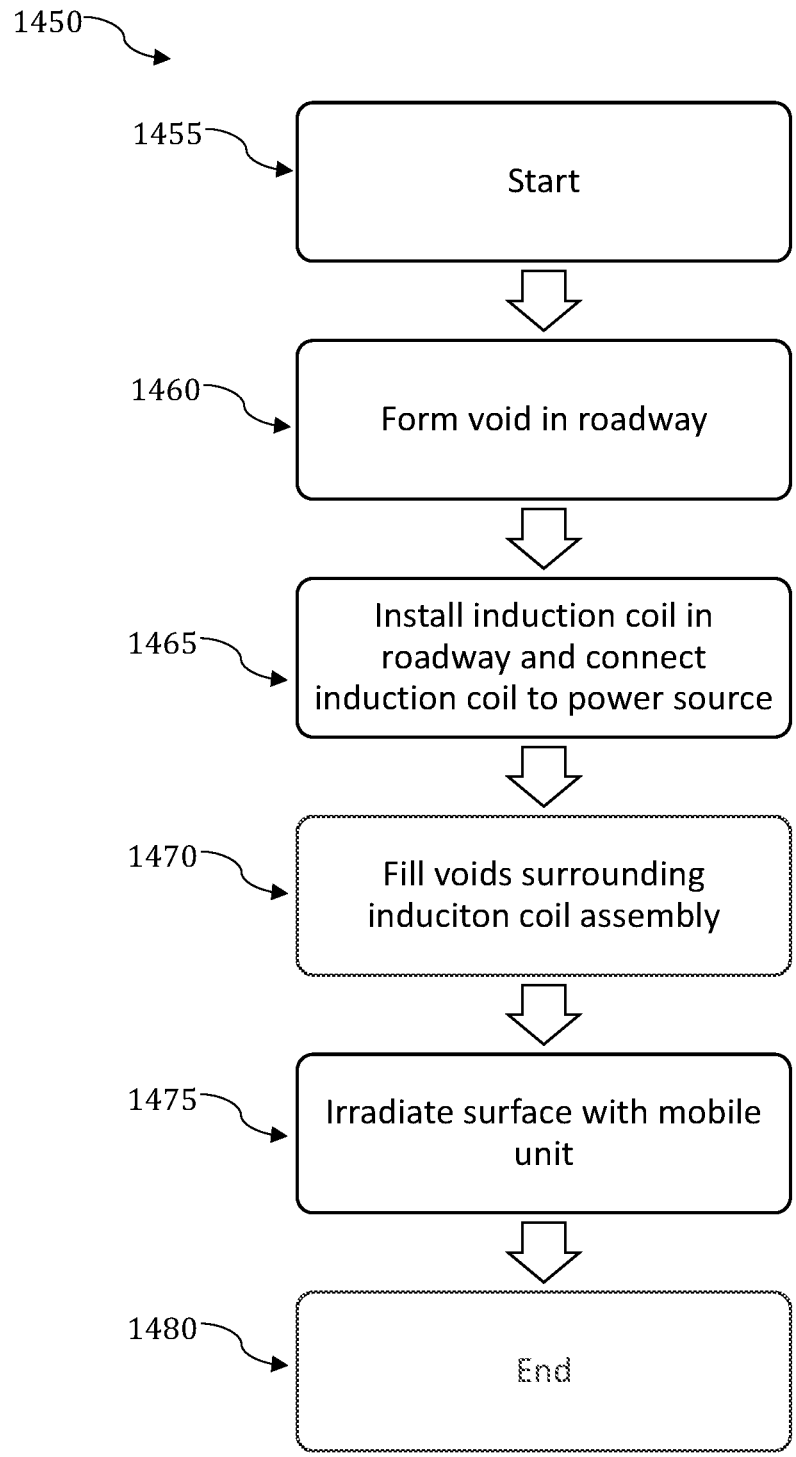
FIG. 14B depicts a method for fabricating an induced electrified road in accordance with the disclosed embodiments.

In order to integrate the inductive coil in the pavement, the surrounding material must be of a low-viscosity, in order to flow around the coil's complex form. Method 1450 illustrated in FIG. 14B provides a process for forming an inductive charging roadway. The method begins at 1455.

At 1460, at least one void can be formed in a roadway. In some cases, this can comprise forming a new roadway, with a void therein. In other cases, this can comprise removing material from an existing roadway to form the void. At 1465, an induction coil can be installed in the void, and the induction coil can be connected to a power source.

Cross-linkable material can next be used to fill the void at 1470. The cross-linkable material should be of a viscosity that allows it to flow around, and cover, the induction coil form factor. Thus, the cross-linkable material can be selected to have a relatively low viscosity so that the completed fill is durable while still conforming closely to the coil's shape. At step 1475, the cross-linkable material can be irradiated according to the methods and systems disclosed herein so that the roadway is completed and smooth. The method ends at 1480.

Many other implementation and configurations are envisioned. For example, the systems and methods disclosed herein can be applied to create functional features in a surface (e.g. increase lateral stiffness, control directional friction, repair damage, or increase draining efficiency). Cracks of arbitrary shape can be targeted, melted and re-rolled. Tiles of pre-formed pavement may be placed and crosslinked together with treatment directed toward the tile interfaces. Grooves can be formed in roads to create musical roads, warning tones, and more descriptive tones that communicate road conditions and locations via electronic interpretation of said tones aboard the vehicle. In other embodiments, extreme-scale additive manufacturing can also be achieved over large swaths of terrain.

Based on the foregoing, it can be appreciated that a number of embodiments, preferred and alternative, are disclosed herein. It should be appreciated that variations of the above-disclosed and other features and functions, or alternatives thereof, may be desirably combined into many other different systems or applications. In an embodiment, a fabrication method comprises defining a desired pattern for imparting on a target area, mapping the target area, defining at least one discrete voxel in the target area, according to the desired pattern to be imparted on the target area, assigning an irradiation value to each of the at least one discrete voxels, and delivering a dose of irradiation to each of the at least one discrete voxels according to the assigned irradiation value.

In an embodiment, the method further comprises delivering the dose of irradiation with an accelerator. In an embodiment the method comprises adjusting a duty factor of the accelerator according to the assigned irradiation value for each of the at least one discrete voxels.

In an embodiment delivering the dose of irradiation further comprises at least one of: directing an electron beam accelerator mounted to a vehicle through the target area, and sweeping an electron beam over the target area. The method further comprises directing the vehicle in a predefined path, wherein the predefined path is selected according to the desired pattern for imparting on the target area. In an embodiment the method further comprises determining a position of the vehicle in the target area with at least one sensor. In an embodiment the method further comprises depositing a cross-linking material in the target area.

In an embodiment the accelerator comprises an electron beam accelerator mounted to a vehicle In an embodiment the target area is at least one of: two-dimensional, and three-dimensional.

In another embodiment the method further comprises iteratively creating a plurality of layers, the plurality of layers forming a three-dimensional structure.

In an embodiment a fabrication system comprises a mobile accelerator system, and a control system configured for: defining a desired pattern for imparting on a target area, mapping the target area defining at least one discrete voxel in the target area, according to the desired pattern to be imparted on the target area, and assigning an irradiation value to each of the at least one discrete voxels; wherein the mobile accelerator system delivers a dose of irradiation to each of the at least one discrete voxels according to the assigned irradiation value.

In an embodiment the mobile accelerator system further comprises a mobile unit, an accelerator, and a beam bending assembly, the beam bending assembly adjusting a terminal position of a beam provided by the accelerator.

In an embodiment the beam bending assembly comprises at least one beam bending magnet. In an embodiment the beam bending assembly comprises a beam bending snout. In an embodiment the beam bending assembly is configured to direct an electron beam from the accelerator through the target area.

In an embodiment the system further comprises a vehicle for moving the mobile accelerator system in a predefined path, the predefined path selected according to the desired pattern for imparting on the target area. The system can further comprise at least one position sensor configured for determining a position of the mobile accelerator assembly in the target area.

In another embodiment a fabrication method comprises designing a structure, defining at least one discrete voxel in the structure, assigning an irradiation value to each of the at least one discrete voxels, covering a build surface with material, and delivering a dose of irradiation to each of the at least one discrete voxels according to the assigned irradiation value.

In an embodiment the method further comprises preparing the build surface for fabrication. In an embodiment the method further comprises iteratively creating a plurality of layers associated with the structure.

It should be understood that various presently unforeseen or unanticipated alternatives, modifications, variations or improvements therein may be subsequently made by those skilled in the art which are also intended to be encompassed by the following claims.

What is claimed is:

1. A fabrication system comprising:
   a mobile accelerator system; and
   a control system configured for:
      defining a desired pattern for imparting on a target area;
      mapping said target area;
      defining at least one discrete voxel in said target area, according to said desired pattern to be imparted on said target area; and
      assigning an irradiation value to each of said at least one discrete voxels;
   wherein said mobile accelerator system delivers a dose of irradiation to each of said at least one discrete voxels according to said assigned irradiation value.

2. The system of claim 1 further comprising:
   a vehicle for moving said mobile accelerator system in a predefined path, said predefined path selected according to said desired pattern for imparting on said target area.

3. The system of claim 1 further comprising:
   at least one position sensor configured for determining a position of said mobile accelerator assembly in said target area.

4. The system of claim 1 wherein said mobile accelerator system further comprises:
   a mobile unit;
   an accelerator; and
   a beam bending assembly, said beam bending assembly adjusting a terminal position of a beam provided by said accelerator.

5. The system of claim 4 wherein said beam bending assembly comprises:
   at least one beam bending magnet.

6. The system of claim 4 wherein said beam bending assembly comprises:
   a beam bending snout.

7. The system of claim 4 wherein said beam bending assembly is configured to direct an electron beam from said accelerator through said target area.

* * * * *